US012577657B2

(12) United States Patent
Timmons et al.

(10) Patent No.: US 12,577,657 B2
(45) Date of Patent: Mar. 17, 2026

(54) VIBRO-THERMALLY ASSISTED CHEMICAL VAPOR INFILTRATION

(71) Applicant: GROUP14 TECHNOLOGIES, INC., Woodinville, WA (US)

(72) Inventors: Christopher Timmons, Monroe, WA (US); Brett Kilcup, Moses Lake, WA (US); Frank Bruneel, Moses Lake, WA (US); Michael R. Pittman, North Price, UT (US); Henry R. Costantino, Woodinville, WA (US); Aaron M. Feaver, Seattle, WA (US)

(73) Assignee: Group14 Technologies, Inc., Woodinville, WA (US)

( * ) Notice: Subject to any disclaimer, the term of this patent is extended or adjusted under 35 U.S.C. 154(b) by 123 days.

(21) Appl. No.: 18/041,190

(22) PCT Filed: Aug. 10, 2021

(86) PCT No.: PCT/US2021/045417
§ 371 (c)(1),
(2) Date: Feb. 9, 2023

(87) PCT Pub. No.: WO2022/035879
PCT Pub. Date: Feb. 17, 2022

(65) Prior Publication Data
US 2023/0304146 A1 Sep. 28, 2023

Related U.S. Application Data

(60) Provisional application No. 63/063,822, filed on Aug. 10, 2020.

(51) Int. Cl.
*C23C 16/04* (2006.01)
*C23C 16/24* (2006.01)
(Continued)

(52) U.S. Cl.
CPC ............ *C23C 16/045* (2013.01); *C23C 16/24* (2013.01); *C23C 16/4417* (2013.01);
(Continued)

(58) Field of Classification Search
CPC ... C23C 16/56; C23C 16/52; C23C 16/45557; C23C 16/4417; C23C 16/24; C23C 16/045
See application file for complete search history.

(56) References Cited

U.S. PATENT DOCUMENTS 2,282,235 A 5/1942 Moberly
3,058,235 A * 10/1962 Morris .................. F26B 17/006
34/171
(Continued)

FOREIGN PATENT DOCUMENTS

CA 2176452 A1 11/1997
CN 1762900 A 4/2006
(Continued)

OTHER PUBLICATIONS

Fraas Arthur P: "Using vibrations in fluidized beds For processes a Single Particle's Motion", Mechanical Engeineering, Jan. 7, 1998 (Jan. 7, 1998) (Year: 1998).*
(Continued)

*Primary Examiner* — Kelly M Gambetta
(74) *Attorney, Agent, or Firm* — Seed Property Law Group LLP

(57) ABSTRACT
Reactor designs and process steps are provided for accomplishing vibro-thermally assisted chemical vapor infiltration (VTA-CVI). The provided reactors and processes overcome the challenges for manufacturing composite materials from porous scaffolds. Such reactors and processes find utility in various applications, including production of battery mate-
(Continued)

rials, including silicon-carbon composites suitable as anode materials for lithium ion batteries.

20 Claims, 5 Drawing Sheets

(51) Int. Cl.

| | | |
|---|---|---|
| *C23C 16/44* | (2006.01) | |
| *C23C 16/455* | (2006.01) | |
| *C23C 16/52* | (2006.01) | |
| *C23C 16/56* | (2006.01) | |

(52) U.S. Cl.

CPC ........ *C23C 16/45557* (2013.01); *C23C 16/52* (2013.01); *C23C 16/56* (2013.01)

(56) References Cited

U.S. PATENT DOCUMENTS

| | | | |
|---|---|---|---|
| 3,518,123 | A | 6/1970 | Katsoulis et al. |
| 3,582,288 | A | 6/1971 | Jenkins et al. |
| 3,619,428 | A | 11/1971 | David |
| 3,634,028 | A | 1/1972 | Hohne |
| 3,790,659 | A | 2/1974 | Storp et al. |
| 3,876,505 | A | 4/1975 | Stoneburner |
| 3,892,580 | A | 7/1975 | Messing |
| 3,977,901 | A | 8/1976 | Buzzelli |
| 4,082,694 | A | 4/1978 | Wennerberg et al. |
| 4,159,913 | A | 7/1979 | Birchall et al. |
| 4,198,382 | A | 4/1980 | Matsui |
| 4,543,341 | A | 9/1985 | Barringer et al. |
| 4,580,404 | A | 4/1986 | Pez et al. |
| 4,769,197 | A | 9/1988 | Kromrey |
| 4,843,015 | A | 6/1989 | Grubbs, Jr. et al. |
| 4,862,328 | A | 8/1989 | Morimoto et al. |
| 4,873,218 | A | 10/1989 | Pekala |
| 4,954,469 | A | 9/1990 | Robinson |
| 4,997,804 | A | 3/1991 | Pekala |
| 4,999,330 | A | 3/1991 | Bose et al. |
| 5,061,416 | A | 10/1991 | Willkens et al. |
| 5,093,216 | A | 3/1992 | Azuma et al. |
| 5,260,855 | A | 11/1993 | Kaschmitter et al. |
| 5,294,498 | A | 3/1994 | Omaru et al. |
| 5,416,056 | A | 5/1995 | Baker |
| 5,420,168 | A | 5/1995 | Mayer et al. |
| 5,465,603 | A | 11/1995 | Anthony et al. |
| 5,508,341 | A | 4/1996 | Mayer et al. |
| 5,529,971 | A | 6/1996 | Kaschmitter et al. |
| 5,614,460 | A | 3/1997 | Schwarz et al. |
| 5,626,637 | A | 5/1997 | Baker |
| 5,626,977 | A | 5/1997 | Mayer et al. |
| 5,670,571 | A | 9/1997 | Gabrielson et al. |
| 5,674,642 | A | 10/1997 | Le et al. |
| 5,710,092 | A | 1/1998 | Baker |
| 5,726,118 | A | 3/1998 | Ivey et al. |
| 5,744,258 | A | 4/1998 | Bai et al. |
| 5,789,338 | A | 8/1998 | Kaschmitter et al. |
| 5,834,138 | A | 11/1998 | Yamada et al. |
| 5,858,486 | A | 1/1999 | Metter et al. |
| 5,882,621 | A | 3/1999 | Doddapaneni et al. |
| 5,891,822 | A | 4/1999 | Oyama et al. |
| 5,908,896 | A | 6/1999 | Mayer et al. |
| 5,945,084 | A | 8/1999 | Droege |
| 5,965,483 | A | 10/1999 | Baker et al. |
| 6,006,797 | A | 12/1999 | Bulow et al. |
| 6,064,560 | A | 5/2000 | Hirahara et al. |
| 6,069,107 | A | 5/2000 | Kuznetsov et al. |
| 6,072,693 | A | 6/2000 | Tsushima et al. |
| 6,096,456 | A | 8/2000 | Takeuchi et al. |
| 6,117,585 | A | 9/2000 | Anani et al. |
| 6,147,213 | A | 11/2000 | Poli et al. |
| 6,153,562 | A | 11/2000 | Villar et al. |
| 6,205,016 | B1 | 3/2001 | Niu |
| 6,225,257 | B1 | 5/2001 | Putyera et al. |
| 6,242,127 | B1 | 6/2001 | Paik et al. |
| 6,268,081 | B1 | 7/2001 | Clough |
| 6,309,446 | B1 | 10/2001 | Nakanoya et al. |
| 6,310,762 | B1 | 10/2001 | Okamura et al. |
| 6,339,528 | B1 | 1/2002 | Lee et al. |
| 6,509,119 | B1 | 1/2003 | Kobayashi et al. |
| 6,574,092 | B2 | 6/2003 | Sato et al. |
| 6,592,838 | B1 | 7/2003 | Nomoto et al. |
| 6,631,072 | B1 | 10/2003 | Paul et al. |
| 6,631,073 | B1 | 10/2003 | Sakata et al. |
| 6,697,249 | B2 | 2/2004 | Maletin et al. |
| 6,764,667 | B1 | 7/2004 | Steiner, III |
| 6,815,105 | B2 | 11/2004 | Cooper et al. |
| 6,865,068 | B1 | 3/2005 | Murakami et al. |
| 7,245,478 | B2 | 7/2007 | Zhong et al. |
| 7,419,649 | B2 | 9/2008 | Lundquist et al. |
| 7,582,902 | B2 | 9/2009 | Tano et al. |
| 7,626,804 | B2 | 12/2009 | Yoshio et al. |
| 7,722,991 | B2 | 5/2010 | Zhang et al. |
| 7,723,262 | B2 | 5/2010 | Feaver et al. |
| 7,754,178 | B2 | 7/2010 | Tano et al. |
| 7,785,495 | B2 | 8/2010 | Kikuchi et al. |
| 7,816,413 | B2 | 10/2010 | Feaver et al. |
| 7,835,136 | B2 | 11/2010 | Feaver et al. |
| 8,158,556 | B2 | 4/2012 | Feaver et al. |
| 8,293,818 | B2 | 10/2012 | Costantino et al. |
| 8,329,252 | B2 | 12/2012 | Makarov et al. |
| 8,361,659 | B2 | 1/2013 | Richard |
| 8,366,979 | B2 | 2/2013 | Dai et al. |
| 8,404,384 | B2 | 3/2013 | Feaver et al. |
| 8,411,415 | B2 | 4/2013 | Yoshinaga et al. |
| 8,467,170 | B2 | 6/2013 | Feaver et al. |
| 8,480,930 | B2 | 7/2013 | Suh et al. |
| 8,482,900 | B2 | 7/2013 | Gadkaree et al. |
| 8,580,870 | B2 | 11/2013 | Costantino et al. |
| 8,654,507 | B2 | 2/2014 | Costantino et al. |
| 8,691,177 | B2 | 4/2014 | Pfeifer et al. |
| 8,709,971 | B2 | 4/2014 | Feaver et al. |
| 8,734,991 | B2 | 5/2014 | Takano et al. |
| 8,797,717 | B2 | 8/2014 | Feaver et al. |
| 8,809,230 | B2 | 8/2014 | Worsley et al. |
| 8,906,978 | B2 | 12/2014 | Costantino et al. |
| 8,916,296 | B2 | 12/2014 | Feaver et al. |
| 8,999,202 | B2 | 4/2015 | Mulik et al. |
| 9,005,812 | B2 | 4/2015 | Ma et al. |
| 9,067,848 | B2 | 6/2015 | Stadie et al. |
| 9,112,230 | B2 | 8/2015 | Feaver et al. |
| 9,133,295 | B2 | 9/2015 | Qureshi et al. |
| 9,133,337 | B2 | 9/2015 | Ludvik et al. |
| 9,136,064 | B2 | 9/2015 | Gadkaree et al. |
| 9,186,174 | B2 | 11/2015 | Krishnan |
| 9,269,502 | B2 | 2/2016 | Chang et al. |
| 9,287,556 | B2 | 3/2016 | Neumann et al. |
| 9,409,777 | B2 | 8/2016 | Geramita et al. |
| 9,412,523 | B2 | 8/2016 | Costantino et al. |
| 9,464,162 | B2 | 10/2016 | Kron et al. |
| 9,580,321 | B2 | 2/2017 | Feaver et al. |
| 9,666,860 | B2 | 5/2017 | Lam et al. |
| 9,680,159 | B2 | 6/2017 | Feaver et al. |
| 9,704,685 | B2 | 7/2017 | Lozano et al. |
| 9,714,172 | B2 | 7/2017 | Geramita et al. |
| 9,985,289 | B2 | 5/2018 | Costantino et al. |
| 10,008,338 | B2 | 6/2018 | Stadermann et al. |
| 10,049,824 | B2 | 8/2018 | Tsukada et al. |
| 10,141,122 | B2 | 11/2018 | Feaver et al. |
| 10,147,950 | B2 | 12/2018 | Sakshaug et al. |
| 10,173,900 | B2 | 1/2019 | Ludvik et al. |
| 10,195,583 | B2 | 2/2019 | Costantino et al. |
| 10,273,328 | B2 | 4/2019 | Kron et al. |
| 10,287,170 | B2 | 5/2019 | Feaver et al. |
| 10,361,428 | B2 | 7/2019 | Kim et al. |
| 10,454,094 | B2 | 10/2019 | Xia et al. |
| 10,454,103 | B2 | 10/2019 | Sakshaug et al. |
| 10,490,358 | B2 | 11/2019 | Feaver et al. |
| 10,522,836 | B2 | 12/2019 | Thompkins et al. |
| 10,590,277 | B2 | 3/2020 | Costantino et al. |
| 10,600,581 | B2 | 3/2020 | Feaver et al. |
| 10,608,254 | B2 | 3/2020 | Sakshaug et al. |
| 10,711,140 | B2 | 7/2020 | Costantino et al. |
| 10,714,744 | B2 | 7/2020 | Sakshaug et al. |

(56) References Cited

U.S. PATENT DOCUMENTS

| | | |
|---|---|---|
| 10,756,347 B2 | 8/2020 | Sakshaug et al. |
| 10,763,501 B2 | 9/2020 | Feaver et al. |
| 10,784,512 B2 | 9/2020 | Sakshaug et al. |
| 10,814,304 B2 | 10/2020 | Costantino et al. |
| 10,923,722 B2 | 2/2021 | Sakshaug et al. |
| 11,174,167 B1 | 11/2021 | Dhanabalan et al. |
| 11,335,903 B2 | 5/2022 | Costantino et al. |
| 11,401,363 B2 | 8/2022 | Geramita et al. |
| 11,437,621 B2 | 9/2022 | Sakshaug et al. |
| 11,492,262 B2 | 11/2022 | Dhanabalan et al. |
| 11,495,793 B2 | 11/2022 | Sakshaug et al. |
| 11,495,798 B1 | 11/2022 | Sakshaug et al. |
| 11,498,838 B2 | 11/2022 | Dhanabalan et al. |
| 11,611,070 B2 | 3/2023 | Costantino et al. |
| 11,611,071 B2 | 3/2023 | Costantino et al. |
| 11,611,073 B2 | 3/2023 | Feaver et al. |
| 11,639,292 B2 | 5/2023 | Costantino et al. |
| 11,646,419 B2 | 5/2023 | Sakshaug et al. |
| 11,661,517 B2 | 5/2023 | Costantino et al. |
| 11,707,728 B2 | 7/2023 | Costantino et al. |
| 11,718,701 B2 | 8/2023 | Geramita et al. |
| 11,725,074 B2 | 8/2023 | Geramita et al. |
| 11,732,079 B2 | 8/2023 | Geramita et al. |
| 2001/0002086 A1 | 5/2001 | Webb |
| 2002/0031706 A1 | 3/2002 | Dasgupta et al. |
| 2002/0031710 A1 | 3/2002 | Kezuka et al. |
| 2002/0036885 A1 | 3/2002 | Lee et al. |
| 2002/0075627 A1 | 6/2002 | Shinozaki et al. |
| 2002/0104474 A1 | 8/2002 | Wakamatsu et al. |
| 2002/0114126 A1 | 8/2002 | Hirahara et al. |
| 2002/0122985 A1 | 9/2002 | Sato et al. |
| 2002/0168314 A1 | 11/2002 | Roemmler |
| 2002/0172637 A1 | 11/2002 | Chesneau et al. |
| 2003/0012722 A1 | 1/2003 | Liu |
| 2003/0013606 A1 | 1/2003 | Hampden-Smith et al. |
| 2003/0013804 A1 | 1/2003 | Phillips et al. |
| 2003/0064564 A1 | 4/2003 | Lin |
| 2003/0064565 A1 | 4/2003 | Maletin et al. |
| 2003/0108785 A1 | 6/2003 | Wu et al. |
| 2003/0170548 A1 | 9/2003 | Otsuki et al. |
| 2004/0010090 A1 | 1/2004 | Chino et al. |
| 2004/0106040 A1 | 6/2004 | Fukuoka et al. |
| 2004/0132845 A1 | 7/2004 | Rhine et al. |
| 2004/0141963 A1 | 7/2004 | Umekawa et al. |
| 2004/0180264 A1 | 9/2004 | Honbo et al. |
| 2004/0241237 A1 | 12/2004 | Pirard et al. |
| 2004/0248730 A1 | 12/2004 | Kim et al. |
| 2004/0248790 A1 | 12/2004 | Hinuma et al. |
| 2005/0014643 A1 | 1/2005 | Lini et al. |
| 2005/0041370 A1 | 2/2005 | Wilk et al. |
| 2005/0058589 A1 | 3/2005 | Lundquist et al. |
| 2005/0058907 A1 | 3/2005 | Kurihara et al. |
| 2005/0079349 A1 | 4/2005 | Hampden-Smith et al. |
| 2005/0079359 A1 | 4/2005 | Fujita et al. |
| 2005/0135993 A1 | 6/2005 | Xu et al. |
| 2005/0153130 A1 | 7/2005 | Long et al. |
| 2005/0196336 A1 | 9/2005 | Chatterjee et al. |
| 2005/0221981 A1 | 10/2005 | Wagh et al. |
| 2005/0233195 A1 | 10/2005 | Arnold et al. |
| 2005/0250011 A1 | 11/2005 | Mitchell et al. |
| 2005/0253220 A1 | 11/2005 | Lin et al. |
| 2005/0266990 A1 | 12/2005 | Iwasaki et al. |
| 2005/0282062 A1 | 12/2005 | Manako et al. |
| 2006/0008408 A1 | 1/2006 | Ho Yoon et al. |
| 2006/0057355 A1 | 3/2006 | Suzuki et al. |
| 2006/0079587 A1 | 4/2006 | Albert et al. |
| 2006/0093915 A1 | 5/2006 | Lundquist et al. |
| 2006/0223965 A1 | 10/2006 | Trifu |
| 2006/0240979 A1 | 10/2006 | Hirahara et al. |
| 2007/0002523 A1 | 1/2007 | Ando et al. |
| 2007/0008677 A1 | 1/2007 | Zhong et al. |
| 2007/0048605 A1 | 3/2007 | Pez et al. |
| 2007/0104981 A1 | 5/2007 | Lam et al. |
| 2007/0113735 A1 | 5/2007 | Feaver et al. |
| 2007/0142222 A1 | 6/2007 | Erkey et al. |
| 2007/0166602 A1 | 7/2007 | Burchardt |
| 2007/0292732 A1 | 12/2007 | Feaver et al. |
| 2008/0011986 A1 | 1/2008 | Yamakawa et al. |
| 2008/0044726 A1 | 2/2008 | Feng et al. |
| 2008/0107804 A1 | 5/2008 | Kondo |
| 2008/0112876 A1 | 5/2008 | Dailey |
| 2008/0132632 A1 | 6/2008 | Schiraldi et al. |
| 2008/0145757 A1 | 6/2008 | Mah et al. |
| 2008/0145761 A1 | 6/2008 | Petrat et al. |
| 2008/0180881 A1 | 7/2008 | Feaver et al. |
| 2008/0201925 A1 | 8/2008 | Zhong et al. |
| 2008/0204973 A1 | 8/2008 | Zhong et al. |
| 2008/0206638 A1 | 8/2008 | Takahashi et al. |
| 2008/0241640 A1 | 10/2008 | Rajeshwar et al. |
| 2008/0268297 A1 | 10/2008 | Quayle et al. |
| 2008/0293911 A1 | 11/2008 | Qureshi et al. |
| 2008/0297981 A1 | 12/2008 | Endo et al. |
| 2008/0299456 A1 | 12/2008 | Shiga et al. |
| 2009/0035344 A1 | 2/2009 | Thomas et al. |
| 2009/0053594 A1 | 2/2009 | Johnson et al. |
| 2009/0097189 A1 | 4/2009 | Tasaki et al. |
| 2009/0104509 A1 | 4/2009 | Kwak et al. |
| 2009/0104530 A1 | 4/2009 | Shizuka et al. |
| 2009/0114544 A1 | 5/2009 | Rousseau et al. |
| 2009/0117466 A1 | 5/2009 | Zhamu et al. |
| 2009/0145482 A1 | 6/2009 | Mitzi et al. |
| 2009/0185327 A1 | 7/2009 | Seymour |
| 2009/0213529 A1 | 8/2009 | Gogotsi et al. |
| 2009/0253248 A1 | 10/2009 | Sun et al. |
| 2009/0286160 A1 | 11/2009 | Kozono et al. |
| 2009/0305131 A1 | 12/2009 | Kumar et al. |
| 2010/0008021 A1 | 1/2010 | Hu et al. |
| 2010/0047671 A1 | 2/2010 | Chiang et al. |
| 2010/0051881 A1 | 3/2010 | Ahn et al. |
| 2010/0092370 A1 | 4/2010 | Zhang et al. |
| 2010/0097741 A1 | 4/2010 | Zhong et al. |
| 2010/0098615 A1 | 4/2010 | Tennison et al. |
| 2010/0110613 A1 | 5/2010 | Zhong et al. |
| 2010/0163791 A1 | 7/2010 | Fukui et al. |
| 2010/0213104 A1 | 8/2010 | Hughes et al. |
| 2010/0215563 A1 | 8/2010 | Yambayashi |
| 2010/0279172 A1 | 11/2010 | Hwang et al. |
| 2010/0288970 A1 | 11/2010 | Watanabe et al. |
| 2010/0310941 A1 | 12/2010 | Kumta et al. |
| 2010/0316907 A1 | 12/2010 | Yamamoto et al. |
| 2010/0331179 A1 | 12/2010 | Feaver et al. |
| 2011/0002086 A1 | 1/2011 | Feaver et al. |
| 2011/0028599 A1 | 2/2011 | Costantino et al. |
| 2011/0053765 A1 | 3/2011 | Feaver et al. |
| 2011/0111284 A1 | 5/2011 | Maeshima et al. |
| 2011/0159375 A1 | 6/2011 | Feaver et al. |
| 2011/0177393 A1 | 7/2011 | Park et al. |
| 2011/0199716 A1 | 8/2011 | Feaver et al. |
| 2011/0200848 A1 | 8/2011 | Chiang et al. |
| 2011/0223494 A1 | 9/2011 | Feaver et al. |
| 2011/0261501 A1 | 10/2011 | Gadkaree et al. |
| 2011/0281180 A1 | 11/2011 | Kim et al. |
| 2011/0287189 A1 | 11/2011 | Shembel et al. |
| 2011/0300447 A1 | 12/2011 | Archer |
| 2011/0311873 A1 | 12/2011 | Schulz et al. |
| 2012/0045685 A1 | 2/2012 | Seki et al. |
| 2012/0081838 A1 | 4/2012 | Costantino et al. |
| 2012/0129049 A1 | 5/2012 | Rayner |
| 2012/0156493 A1 | 6/2012 | Maisels et al. |
| 2012/0156567 A1 | 6/2012 | Ayme-Perrot et al. |
| 2012/0183856 A1 | 7/2012 | Cui et al. |
| 2012/0202033 A1 | 8/2012 | Chang et al. |
| 2012/0241691 A1 | 9/2012 | Soneda et al. |
| 2012/0251876 A1 | 10/2012 | Jagannathan |
| 2012/0262127 A1 | 10/2012 | Feaver et al. |
| 2012/0264020 A1 | 10/2012 | Burton et al. |
| 2012/0305651 A1 | 12/2012 | Anderson et al. |
| 2012/0308870 A1 | 12/2012 | Okuda et al. |
| 2012/0321959 A1 | 12/2012 | Yushin et al. |
| 2013/0004841 A1 | 1/2013 | Thompkins et al. |
| 2013/0020349 A1 | 1/2013 | Feaver et al. |
| 2013/0082213 A1 | 4/2013 | Duncan et al. |
| 2013/0157151 A1 | 6/2013 | Feaver et al. |
| 2013/0169238 A1 | 7/2013 | Rojeski |

(56) References Cited

U.S. PATENT DOCUMENTS

| | | |
|---|---|---|
| 2013/0189472 A1 | 7/2013 | Takaoka |
| 2013/0189575 A1 | 7/2013 | Anguchamy et al. |
| 2013/0196158 A1 | 8/2013 | Yoshida et al. |
| 2013/0244862 A1 | 9/2013 | Ivanovici et al. |
| 2013/0252082 A1 | 9/2013 | Thompkins et al. |
| 2013/0280601 A1 | 10/2013 | Geramita et al. |
| 2013/0295462 A1 | 11/2013 | Atanassova et al. |
| 2013/0321982 A1 | 12/2013 | Feaver et al. |
| 2013/0337334 A1 | 12/2013 | Tao et al. |
| 2013/0344363 A1 | 12/2013 | Upadhyaya |
| 2013/0344391 A1 | 12/2013 | Yushin et al. |
| 2014/0038042 A1 | 2/2014 | Rios et al. |
| 2014/0045685 A1 | 2/2014 | Iguchi et al. |
| 2014/0057179 A1 | 2/2014 | Yushin et al. |
| 2014/0094572 A1 | 4/2014 | Costantino et al. |
| 2014/0170482 A1 | 6/2014 | Park et al. |
| 2014/0220456 A1 | 8/2014 | Costantino et al. |
| 2014/0272592 A1 | 9/2014 | Thompkins et al. |
| 2014/0287317 A1 | 9/2014 | Tiquet et al. |
| 2014/0302396 A1 | 10/2014 | Lu et al. |
| 2014/0335410 A1 | 11/2014 | Loveridge et al. |
| 2015/0037249 A1 | 2/2015 | Fu |
| 2015/0062781 A1 | 3/2015 | Feaver et al. |
| 2015/0087731 A1 | 3/2015 | Dong et al. |
| 2015/0155546 A1 | 6/2015 | Yushin et al. |
| 2015/0162603 A1 | 6/2015 | Yushin et al. |
| 2015/0207148 A1 | 7/2015 | Kimura et al. |
| 2015/0238917 A1 | 8/2015 | Mulik et al. |
| 2015/0255781 A1 | 9/2015 | Hashimoto |
| 2015/0255800 A1 | 9/2015 | Feaver et al. |
| 2015/0283534 A1 | 10/2015 | Costantino et al. |
| 2015/0306570 A1 | 10/2015 | Mayes et al. |
| 2016/0010250 A1 | 1/2016 | Taninaka et al. |
| 2016/0039970 A1 | 2/2016 | Kron et al. |
| 2016/0043384 A1 | 2/2016 | Zhamu et al. |
| 2016/0104882 A1 | 4/2016 | Yushin et al. |
| 2016/0122185 A1 | 5/2016 | Feaver et al. |
| 2016/0133394 A1 | 5/2016 | Sakshaug et al. |
| 2016/0344030 A1 | 11/2016 | Sakshaug et al. |
| 2016/0372750 A1 | 12/2016 | Chang et al. |
| 2017/0015559 A1 | 1/2017 | Costantino et al. |
| 2017/0152340 A1 | 6/2017 | Geramita et al. |
| 2017/0155148 A1 | 6/2017 | Costantino et al. |
| 2017/0170477 A1 | 6/2017 | Sakshaug et al. |
| 2017/0200566 A1 | 7/2017 | Stadermann et al. |
| 2017/0316888 A1 | 11/2017 | Geramita et al. |
| 2017/0346084 A1 | 11/2017 | Sakshaug et al. |
| 2017/0349442 A1 | 12/2017 | Feaver et al. |
| 2018/0097240 A1 | 4/2018 | Feaver et al. |
| 2018/0130609 A1 | 5/2018 | Feaver et al. |
| 2018/0294484 A1 | 10/2018 | Fredrick et al. |
| 2018/0331356 A1 | 11/2018 | Feaver et al. |
| 2019/0088931 A1 | 3/2019 | Abrahamson et al. |
| 2019/0097222 A1 | 3/2019 | Feaver et al. |
| 2019/0103608 A1 | 4/2019 | Costantino et al. |
| 2019/0144287 A1 | 5/2019 | Park et al. |
| 2019/0259546 A1 | 8/2019 | Kron et al. |
| 2019/0267622 A1 | 8/2019 | Sakshaug et al. |
| 2019/0280298 A1 | 9/2019 | Sakshaug et al. |
| 2019/0287737 A1 | 9/2019 | Feaver et al. |
| 2019/0358607 A1 | 11/2019 | Costantino et al. |
| 2020/0020935 A1 | 1/2020 | Costantino et al. |
| 2020/0048098 A1 | 2/2020 | Feaver et al. |
| 2020/0144619 A1 | 5/2020 | Hamilton et al. |
| 2020/0148886 A1 | 5/2020 | Costantino et al. |
| 2020/0152983 A1 | 5/2020 | Sakshaug et al. |
| 2020/0259178 A1 | 8/2020 | Chang et al. |
| 2020/0259181 A1 | 8/2020 | Thompkins et al. |
| 2020/0280070 A1 | 9/2020 | Sakshaug et al. |
| 2020/0290882 A1 | 9/2020 | Fredrick et al. |
| 2020/0303737 A1 | 9/2020 | Kang et al. |
| 2020/0365896 A1 | 11/2020 | Sakshaug et al. |
| 2021/0054213 A1 | 2/2021 | Costantino et al. |
| 2021/0057736 A1 | 2/2021 | Feaver et al. |
| 2021/0126251 A1 | 4/2021 | Sakshaug et al. |
| 2021/0175498 A1 | 6/2021 | Feaver et al. |
| 2021/0237029 A1 | 8/2021 | Costantino et al. |
| 2021/0276875 A1 | 9/2021 | Mason et al. |
| 2022/0059818 A1 | 2/2022 | Dhanabalan et al. |
| 2022/0074045 A1* | 3/2022 | Yilmaz .................. H01M 10/05 |
| 2022/0231296 A1 | 7/2022 | Sakshaug et al. |
| 2022/0246910 A1 | 8/2022 | Mason et al. |
| 2022/0352517 A1 | 11/2022 | Sakshaug et al. |
| 2022/0389146 A1 | 12/2022 | Geramita et al. |
| 2023/0016325 A1 | 1/2023 | Geramita et al. |
| 2023/0022154 A1 | 1/2023 | Geramita et al. |
| 2023/0058348 A1 | 2/2023 | Sakshaug et al. |
| 2023/0115078 A1 | 4/2023 | Sakshaug et al. |
| 2023/0155112 A1 | 5/2023 | Costantino et al. |
| 2023/0155120 A1 | 5/2023 | Feaver et al. |
| 2023/0219819 A1 | 7/2023 | Dhanabalan et al. |
| 2023/0246176 A1 | 8/2023 | Costantino et al. |

FOREIGN PATENT DOCUMENTS

| | | |
|---|---|---|
| CN | 1877888 A | 12/2006 |
| CN | 1986401 A | 6/2007 |
| CN | 101284665 A | 10/2008 |
| CN | 101292389 A | 10/2008 |
| CN | 101318648 A | 12/2008 |
| CN | 101604743 A | 12/2009 |
| CN | 101292389 B | 9/2010 |
| CN | 101969120 A | 2/2011 |
| CN | 102163720 A | 8/2011 |
| CN | 102214817 A | 10/2011 |
| CN | 102623680 A | 8/2012 |
| CN | 102820455 A | 12/2012 |
| CN | 103094528 A | 5/2013 |
| CN | 103456929 A | 12/2013 |
| CN | 103746098 A | 4/2014 |
| CN | 104108698 A | 10/2014 |
| CN | 102509781 B | 11/2015 |
| CN | 105680023 A | 6/2016 |
| CN | 106207108 A | 12/2016 |
| CN | 108475779 A | 8/2018 |
| DE | 10 2014 211012 A1 | 12/2015 |
| EP | 0126191 A2 | 11/1984 |
| EP | 0649815 A1 | 4/1995 |
| EP | 0861804 A1 | 9/1998 |
| EP | 0891943 A1 | 1/1999 |
| EP | 1049116 A1 | 11/2000 |
| EP | 1052716 A2 | 11/2000 |
| EP | 1514859 A2 | 3/2005 |
| EP | 2117068 A1 | 11/2009 |
| EP | 2330676 A1 | 6/2011 |
| EP | 2983186 A1 | 2/2016 |
| JP | H02300222 A | 12/1990 |
| JP | H0390615 A | 4/1991 |
| JP | H03137010 A | 6/1991 |
| JP | H0459806 A | 2/1992 |
| JP | H04139174 A | 5/1992 |
| JP | H05117493 A | 5/1993 |
| JP | H05156121 A | 6/1993 |
| JP | H05311512 A | 11/1993 |
| JP | H05320955 A | 12/1993 |
| JP | H0859919 A | 3/1996 |
| JP | H08112539 A | 5/1996 |
| JP | H0963905 A | 3/1997 |
| JP | H09275042 A | 10/1997 |
| JP | H10297912 A | 11/1998 |
| JP | 2001089119 A | 4/2001 |
| JP | 2001278609 A | 10/2001 |
| JP | 2003303588 A | 10/2003 |
| JP | 2004067498 A | 3/2004 |
| JP | 2004203715 A | 7/2004 |
| JP | 2004221332 A | 8/2004 |
| JP | 2004315283 A | 11/2004 |
| JP | 2005132696 A | 5/2005 |
| JP | 2005136397 A | 5/2005 |
| JP | 2005187320 A | 7/2005 |
| JP | 2006117475 A | 5/2006 |
| JP | 2006248848 A | 9/2006 |
| JP | 2006264993 A | 10/2006 |
| JP | 2007039289 A | 2/2007 |

(56)                    References Cited

FOREIGN PATENT DOCUMENTS

| JP | 2007115749 A | 5/2007 |
| JP | 2008007387 A | 1/2008 |
| JP | 2008008539 A | 1/2008 |
| JP | 2008094925 A | 4/2008 |
| JP | 2009259803 A | 11/2009 |
| JP | 5339107 B1 | 11/2013 |
| JP | 2015130287 A | 7/2015 |
| JP | 5796263 B1 | 10/2015 |
| JP | 2016027222 A | 2/2016 |
| JP | 2016100225 A | 5/2016 |
| JP | 2016100226 A | 5/2016 |
| JP | 2016132608 A | 7/2016 |
| KR | 10-2004-0080010 A | 9/2004 |
| KR | 10-2007-0030881 A | 3/2007 |
| KR | 10-2014-0112451 A | 9/2014 |
| WO | 9501165 A1 | 1/1995 |
| WO | 0239468 A2 | 5/2002 |
| WO | 2004087285 A1 | 10/2004 |
| WO | 2004099073 A2 | 11/2004 |
| WO | 2005043653 A1 | 5/2005 |
| WO | 2009032104 A2 | 3/2009 |
| WO | 2010138760 A2 | 12/2010 |
| WO | 2011157013 A1 | 12/2011 |
| WO | 2014133070 A1 | 9/2014 |
| WO | 2020128523 A1 | 6/2020 |

OTHER PUBLICATIONS

Chmiola et al. Anomalous Increase in Carbon Capacitance at Pore Sizes Less Than 1 Nanometer, Science, vol. 313, Sep. 22, 2006, pp. 1760-1763. (Year: 2006).*

U.S. Appl. No. 17/946,964, filed Sep. 16, 2022.

U.S. Appl. No. 17/960,707, filed Oct. 5, 2022.

U.S. Appl. No. 17/960,698, filed Oct. 5, 2022.

U.S. Appl. No. 18/156,926, filed Jan. 19, 2023.

U.S. Appl. No. 18/156,939, filed Jan. 19, 2023.

U.S. Appl. No. 18/157,567, filed Jan. 20, 2023.

U.S. Appl. No. 18/041,190, filed Feb. 9, 2023.

U.S. Appl. No. 18/042,173, filed Feb. 17, 2023.

U.S. Appl. No. 18/042,178, filed Feb. 17, 2023.

U.S. Appl. No. 18/128,910, filed Mar. 30, 2023.

U.S. Appl. No. 18/128,921, filed Mar. 30, 2023.

U.S. Appl. No. 18/297,478, filed Apr. 7, 2023.

U.S. Appl. No. 18/299,341, filed Apr. 12, 2023.

U.S. Appl. No. 18/328,634, filed Jun. 2, 2023.

U.S. Appl. No. 18/364,411, filed Aug. 2, 2023.

U.S. Appl. No. 18/456,428, filed Aug. 25, 2023.

U.S. Appl. No. 18/456,351, filed Aug. 25, 2023.

"Chemical Basics of Polymer Insulation Materials: 3.6 Implementation Method of Stepwise Polymerization," in Changming Li (eds.), *HITP Harbin Institute of Technology Press*, 2007, pp. 73 (With English Translation) (4 Pages).

Abraham et al., "A Polymer Electrolyte-Based Rechargeable Lithium/Oxygen Battery," *J. Electrochem. Soc.* 143(1):1-5, Jan. 1996.

Abánades et al., "Experimental Analysis of Direct Thermal Methane Cracking," *International Journal of Hydrogen Energy* 36(20):12877-12886, 2011.

Alcañiz-Monge et al., "Methane Storage in Activated Carbon Fibres," *Carbon* 35(2):291-297, 1997.

Alias et al., "Silicon/graphite nanocomposite electrodes prepared by low pressure chemical vapor deposition," *Journal of Power Sources* 174:900-904, 2007.

Andreasen et al., "Ueber die Beziehung zwischen Kornabstufung und Zwischenraum in Produkten aus losen Körnern (mit einigen Experimenten)," *Kolloid-Zeitschrift* 50(3):217-228, Mar. 1930, with translation of summary. (17 pages).

Babić et al., "Carbon cryogel as support of platinum nano-sized electrocatalyst for the hydrogen oxidation reaction," *Electrochimica Acta* 51:3820-3826, 2006.

Babić et al., "Characterization of carbon cryogel synthesized by sol-gel polycondensation and freeze-drying," *Carbon* 42:2617-2624, 2004.

Babić et al., "Characterization of carbon cryogels synthesized by sol-gel polycondensation," *J. Serb. Chem. Soc.* 70(1):21-31, 2005.

Barbieri et al., "Capacitance limits of high surface area activated carbons for double layer capacitors," *Carbon* 43:1303-1310, 2005.

Barton et al., "Tailored Porous Materials," *Chem. Mater.* 11:2633-2656, 1999.

Beattie et al., "High-Capacity Lithium-Air Cathodes," *J. Electrochem. Soc.* 156(1):A44-A47, 2009.

Besenhard, "Handbook of battery materials," Weinheim, Wiley-VCH, Weinheim, New York, 398-401, Dec. 31, 1999.

Bock et al., "Structural Investigation of Resorcinol Formaldehyde and Carbon Aerogels Using SAXS and BET," *Journal of Porous Materials* 4:287-294, 1997.

Buiel et al., "Li-insertion in hard carbon anode materials for Li-ion batteries," *Electrochimica Acta* 45:121-130, 1999.

Burchell et al., "Low Pressure Storage of Natural Gas for Vehicular Applications," *The Engineering Society for Advancing Mobility Land Sea Air and Space, Government/Industry Meeting*, Washington D.C., Jun. 19-21, 2000, 7 pages.

Cao et al., "Li-ion capacitors with carbon cathode and hard carbon/stabilized lithium metal powder anode electrodes," *Journal of Power Sources* 213:180-185, Apr. 2012.

Chang et al., "Carbon Materials Comprising Enhanced Electrochemical Properties," U.S. Appl. No. 14/988,625, filed Jan. 5, 2016, 112 pages.

Chmiola et al., "Anomalous Increase in Carbon Capacitance at Pore Sizes Less Than 1 Nanometer," *Science* 313:1760-1763, Sep. 22, 2006.

Conway et al., "Partial Molal Volumes of Tetraalkylammonium Halides and Assignment of Individual Ionic Contributions," *Trans. Faraday Soc.* 62:2738-2749, 1966.

Coppey et al., "Fluidized Bed Chemical Vapor Deposition of Silicon on Carbon Nanotubes for Li-Ion Batteries," *Journal of Nanoscience and Nanotechnology* 11(9):8392-8395, 2011.

Czakkel et al., "Influence of drying on the morphology of resorcinol-formaldehyde-based carbon gels," *Microporous and Mesoporous Materials* 86:124-133, 2005.

De Lange et al., "Adsorptive characterization of porous solids: Error analysis guides the way," *Microporous and Mesoporous Materials* 200:199-215, Sep. 2014.

Ding et al., "How Conductivities and Viscosities of PC-DEC and PC-EC Solutions of LiBF4, LiPF6, LiBOB, Et4NBF4, and Et4NBF6 Differ and Why," *Journal of The Electrochemical Society* 151(12):A2007-A2015, 2004.

Dinger et al., "Particle Packing III—Discrete versus Continuous Particle Sizes," *Interceram* 41(5):332-334, 1992.

Dinger et al., "Particle Packing IV—Computer Modelling of Particle Packing Phenomena," *Interceram* 42(3):150-152, 1993.

Débart et al., "α-MnO2 Nanowires: A Catalyst for the O2 Electrode in Rechargeable Lithium Batteries," *Agnew. Chem. Int. Ed.* 47:4521-4524, 2008.

Eikerling et al., "Optimized Structure of Nanoporous Carbon-Based Double-Layer Capacitors," *Journal of The Electrochemical Society* 152(1):E24-E33, 2005.

Endo et al., "Morphology and organic EDLC applications of chemically activated AR-resin-based carbons," *Carbon* 40:2613-2626, 2002.

Feaver et al., "Activated carbon cryogels for low pressure methane storage," *Carbon* 44:590-593, 2006.

Fotouhi et al., "A Low Cost, Disposable Cable-Shaped AI-Air Battery for Portable Biosensors," *J. Micromech. Microeng.* 26:055011, 2016. (8 pages).

Fraas, "Using vibrations in fluidized beds For processes that do not require a high flow rate of sweep gas, the complex-mode vibration fluidized bed offers lower power needs, attrition rates, and elutriation rates than gas-fluidized beds or rotary kilns," *Mechanical Engineering*:76-79, Jan. 7, 1998.

Furnas, "Grading Aggregates I—Mathematical Relations for Beds of Broken Solids of Maximum Density," *Industrial and Engineering Chemistry* 23(9):1052-1058, 1931.

(56)     References Cited

OTHER PUBLICATIONS

Gao et al., "Nitrogen-rich graphene from small molecules as high performance anode material," *Nanotechnology* 25:415402, 2014, 8 pages.

Hahn et al., "A dilatometric study of the voltage limitation of carbonaceous electrodes in aprotic EDLC type electrolytes by charge-induced strain," *Carbon* 44:2523-2533, 2006.

Hasegawa et al., "Preparation of carbon gel microspheres containing silicon powder for lithium ion battery anodes," *Carbon* 42:2573-2579, 2004.

Hirscher et al., "Are carbon nanostructures an efficient hydrogen storage medium?" *Journal of Alloys and Compounds* 356-357:433-437, 2003.

Hogness et al. "The Thermal Decomposition of Silane," *J. Am. Chem. Soc.* 58(1):108-112, 1936.

Hong et al., "Hydrogen evolution inhibition with diethylenetriamine modification of activated carbon for a lead-acid battery," *RSC Adv.* 4:33574-33577, 2014.

Hsieh et al., "Synthesis of mesoporous carbon composite and its electric double-layer formation behavior," *Microporous and Mesoporous Materials* 93:232-239, 2006.

Hu et al., "Effects of electrolytes and electrochemical pretreatments on the capacitive characteristics of activated carbon fabrics for supercapacitors," *Journal of Power Sources* 125:299-308, 2004.

Huang et al., "Nitrogen-containing mesoporous carbons prepared from melamine formaldehyde resins with CaC12 as a template," *J. Colloid Interface Sci.* 363(1):193-198, 2011.

Indo German Carbons Limited, "Activated Carbon," Apr. 2009, URL=http://www.igcl.com/php/activated_carbon.php, download date Nov. 29, 2018, 3 pages.

Inomata et al., "Natural gas storage in activated carbon pellets without a binder," *Carbon* 40:87-93, 2002.

Job et al., "Carbon aerogels, cryogels and xerogels: Influence of the drying method on the textural properties of porous carbon materials," *Carbon* 43:2481-2494, 2005.

Job et al., "Highly dispersed platinum catalysts prepared by impregnation of texture-tailored carbon xerogels," *Journal of Catalysis* 240:160-171, 2006.

Job et al., "Synthesis of transition metal-doped carbon xerogels by solubilization of metal salts in resorcinol-formaldehyde aqueous solution," *Carbon* 42:3217-3227, 2004.

Katsaros et al., "Preparation and characterisation of gas selective microporous carbon membranes," *Microporous and Mesoporous Materials* 99:181-189, 2007.

Kim et al., "Adsorption of phenol and reactive dyes from aqueous solution on carbon cryogel microspheres with controlled porous structure," *Microporous and Mesoporous Materials* 96:191-196, 2006.

Kim et al., "Correlation between the capacitor performance and pore structure," *Tanso* 221:31-39, 2006 (English Abstract).

Kocklenberg et al., "Texture control of freeze-dried resorcinol-formaldehyde gels," *Journal of Non-Crystalline Solids* 225:8-13, 1998.

Kowalczyk et al., "Estimation of the pore-size distribution function from the nitrogen adsorption isotherm. Comparison of density functional theory and the method of Do and co-workers," *Carbon* 41:1113-1125, 2003.

Lozano-Castelló et al., "Influence of pore structure and surface chemistry on electric double layer capacitance in non-aqueous electrolyte," *Carbon* 41:1765-1775, 2003.

Lozano-Castelló et al., "Powdered Activated Carbons and Activated Carbon Fibers for Methane Storage: A Comparative Study," *Energy & Fuels* 16:1321-1328, 2002.

McEwen et al., "Nonaqueous Electrolytes and Novel Packaging Concepts for Electrochemical Capacitors," The 7th International Seminar on Double Layer capacitors and Similar Energy Storage Devices, Deerfield Beach, FL Dec. 8-10, 1997, 56 pages.

Miller, "Pulse Power Performance of Electrochemical Capacitors: Technical Status Of Present Commercial Devices," Proceedings of the 8th International Seminar on Double Layer Capacitors and Similar Energy Storage Devices, Deerfield Beach, Florida, Dec. 7-9, 1998, 9 pages.

Naoi et al., "Second generation 'nanohybrid supercapacitor': Evolution of capacitive energy storage devices," *Energy Environ. Sci.* 5:9363-9373, 2012.

Nishihara et al., "Preparation of resorcinol-formaldehyde carbon cryogel microhoneycombs," *Carbon* 42:899-901, 2004.

Ogasawara et al., "Rechargeable LI2O2 Electrode for Lithium Batteries," *Journal of the American Chemical Society* 128(4):1390-1393, 2006.

Otowa et al., "Production and adsorption characteristics of MAXSORB: High-surface-area active carbon," *Gas Separation and Purification* 7(4):241-245, 1993.

Pekala et al., "Aerogels derived from multifunctional organic monomers," *Journal of Non-Crystalline Solids* 145:90-98, 1992.

Pekala et al., "Structure of Organic Aerogels. 1. Morphology and Scaling," *Macromolecules* 26:5487-5493, 1993.

Pekala, "Organic aerogels from the polycondensation of resorcinol with formaldehyde," *Journal of Materials Science* 24:3221-3227, 1989.

Perrin et al., "Methane Storage within Dry and Wet Active Carbons: A Comparative Study," *Energy & Fuels* 17:1283-1291, 2003.

Pimenta et al., "Studying disorder in graphite-based systems by Raman spectroscopy," *Phys. Chem. Chem. Phys.* 9:1276-1291, 2007.

Pojanavaraphan et al., "Prevulcanized natural rubber latex/clay aerogel nanocomposites," *European Polymer Journal* 44:1968-1977, 2008.

Pääkkö, "Long and entangled native cellulose I nanofibers allow flexible aerogels and hierarchically porous templates for functionalities," *Soft Matter* 4:2492-2499, 2008.

Qu et al., "Studies of activated carbons used in double-layer capacitors," *Journal of Power Sources* 74:99-107, 1998.

Ravikovitch et al., "Unified Approach to Pore Size Characterization of Microporous Carbonaceous Materials from N2, Ar, and CO2 Adsorption Isotherms," *Langmuir* 16:2311-2320, 2000.

Read et al., "Oxygen Transport Properties of Organic Electrolytes and Performance of Lithium/Oxygen Battery," *J. Electrochem. Soc.* 150(10):A1351-A1356, 2003.

Read, "Characterization of the Lithium/Oxygen Organic Electrolyte Battery," *J. Electrochemical Soc.* 149(9):A1190-A1195, 2002.

Read, "Ether-Based Electrolytes for the Lithium/Oxygen Organic Electrolyte Battery," *J. Electrochem. Soc.* 153(1):A96-A100, 2006.

Reichenauer et al., "Microporosity in carbon aerogels," *Journal of Non-Crystalline Solids* 225:210-214, 1998.

Salitra et al., "Carbon Electrodes for Double-Layer Capacitors I. Relations Between Ion and Pore Dimensions," *Journal of The Electrochemical Society* 147(7):2486-2493, 2000.

Setoyama et al., "Simulation Study On The Relationship Between A High Resolution αs-Plot And The Pore Size Distribution For Activated Carbon," *Carbon* 36(10):1459-1467, 1998.

Simon et al., "Materials for electrochemical capacitors," *Nature Materials* 7:845-854, Nov. 2008.

Sivakkumar et al., "Evaluation of Lithium-ion capacitors assembled with pre-lithiated graphite anode and activated carbon cathode," *Electrochimica Acta* 65:280-287, Jan. 2012.

Tamon et al., "Influence of freeze-drying conditions on the mesoporosity of organic gels as carbon precursors," *Carbon* 38:1099-1105, 2000.

Tamon et al., "Preparation of mesoporous carbon by freeze drying," *Carbon* 37:2049-2055, 1999.

Tonanon et al., "Influence of surfactants on porous properties of carbon cryogels prepared by sol-gel polycondensation of resorcinol and formaldehyde," *Carbon* 41:2981-2990, 2003.

Toyo Tanso Carbon Products, "Special Graphite and Compound Material Products," Toyo Tanso Co., Ltd. Catalog published 2008.

Toyo Tanso, "Graphite Applications," Toyo Tanso Co., Ltd. Catalog published 1998. (Machine Translation Attached).

Toyo Tanso, "Isotropic Graphite Engineering Data," Toyo Tanso Co., Ltd. Catalog published 1994.

Toyo Tanso, "Isotropic Graphite Technical Data," Toyo Tanso Co., Ltd. Catalog published 1997.

(56) References Cited

OTHER PUBLICATIONS

Ue, "Mobility and Ionic Association of Lithium and Quaternary Ammonium Salts in Propylene Carbonate and γ-Butyrolactone," *J. Electrochem. Soc.* 141(12):3336-3342, Dec. 1994.

Wang et al., "MnO Nanoparticles Interdispersed in 3D Porous Carbon Framework for High Performance Lithium-Ion Batteries," ACS Applied Materials & Interfaces 3:12713-12718, 2014.

Wei et al., "A novel electrode material for electric double-layer capacitors," *Journal of Power Sources* 141:386-391, 2005.

Williford et al., "Air electrode design for sustained high power operation of Li/air batteries," *Journal of Power Sources* 194:1164-1170, 2009.

Woo et al., "Silicon Embedded Nanoporous Carbon Composite for the Anode of Li Ion Batteries," *Journal of The Electrochemical Society* 159(8):A1273-A1277, 2012.

Wu et al., "Fabrication and nano-structure control of carbon aerogels via a microemulsion-templated sol-gel polymerization method," *Carbon* 44:675-681, 2006.

Xiang et al., "Beneficial effects of activated carbon additives on the performance of negative lead-acid battery electrode for high-rate partial-state-of-charge operation," *Journal of Power Sources* 241:150-158, 2013.

Xie et al., "Pore size control of Pitch-based activated carbon fibers by pyrolytic deposition of propylene," *Applied Surface Science* 250:152-160, 2005.

Xu et al., "Comparison of sizing small particles using different technologies," *Powder Technology* 132:145-153, 2003.

Xu et al., "Optimization of Nonaqueous Electrolytes for Primary Lithium/Air Batteries Operated in Ambient Environment," *Journal of the Electrochemical Society* 156(10):A773-A779, 2009.

Xu et al., "Synthesis of mesoporous carbon and its adsorption property to biomolecules," *Microporous and Mesoporous Materials* 115:461-468, 2008.

Yamamoto et al., "Control of mesoporosity of carbon gels prepared by sol-gel polycondensation and freeze drying," *Journal of Non-Crystalline Solids* 288:46-55, 2001.

Yamamoto et al., "Porous properties of carbon gel microspheres as adsorbents for gas separation," *Carbon* 42:1671-1676, 2004.

Yamamoto et al., "Preparation and characterization of carbon cryogel microspheres," *Carbon* 40:1345-1351, 2002.

Yang et al., "Preparation of highly microporous and mesoporous carbon from the mesophase pitch and its carbon foams with KOH," *Carbon* 42:1872-1875, 2004.

Zhang et al., "Discharge characteristic of non-aqueous electrolyte Li/O2 battery," *Journal of Power Sources* 195:1235-1240, 2010.

Zhang et al., "Highly Reversible and Large Lithium Storage in Mesoporous Si/C Nanocomposite Anodes with Silicon Nanoparticles Embedded in a Carbon Framework," *Adv. Mater.* 26:6749-6755, 2014.

Zhao et al., "Facile Synthesis for LiFePO4 Nanospheres in Tridmensional Porous Carbon Framework for Lithium Ion Batteries," *The Journal of Physical Chemistry* 115:2888-2894, 2011.

Zhao et al., "Highly-Ordered Mesoporous Carbon Nitride with Ultrahigh Surface Area and Pore Volume as a Superior Dehydrogenation Catalyst," *Chem. Mater.* 26(10):3151-3161, 2014.

"Bestimmung der Porenvolumenverteilung und der spezifischen Oberfläche von Feststoffen durch Quecksilberintrusion," Duetsche Norm, No. DIN 66133, XP007921315, Jun. 1993. (3 Pages).

* cited by examiner

Process Retort

Inlet Material Feed Chute

Exhaust Gas Lance

Heated Air Outlet

Convey Surface Heated by Hot Air from Plenum Beneath

Vibration Generator

Spring Isolation Footings

Process Gas Injector

Product Discharge

Heated Air Inlet

VIBRO-THERMALLY ASSISTED CHEMICAL VAPOR INFILTRATION

BACKGROUND

Technical Field

Embodiments of the present invention generally relate to novel reactors and methods of manufacturing suitable for carrying out chemical vapor infiltration to produce composite materials from porous scaffolds. The porous scaffold may be in particulate form. Suitable porous scaffolds include, but are not limited to, porous carbon scaffolds, for example carbon having a pore volume comprising micropores (less than 2 nm), mesopores (2 to 50 nm), and/or macropores (greater than 50 nm). Suitable precursors for the carbon scaffold include, but are not limited to, sugars and polyols, organic acids, phenolic compounds, cross-linkers, and amine compounds. Suitable compositing materials include, but are not limited to, silicon materials. Precursors for the silicon include, but are not limited to, silicon containing gases such as silane, high-order silanes (such as di-, tri-, and/or tetrasilane), and/or chlorosilane(s) (such as mono-, di-, tri-, and tetrachlorosilane) and mixtures thereof. Chemical vapor infiltration (CVI) of silicon into the pores of porous scaffold materials is accomplished by exposing said porous scaffold to silicon-containing gas (e.g., silane) at elevated temperatures (e.g., >250 C). In this regard, considerable barriers exist in the current art. As such, key challenges are the gas-solid boundary (i.e., achieving sufficient gas-solid contact to promote the CVI reaction), heat transfer in the porous scaffold (i.e., achieving sufficient level and uniformity of temperature to promote the CVI reaction), elutriation of the particulate porous scaffold, and flowability and processability of the porous scaffold.

Description of the Related Art

CVI is a process wherein a gaseous substrate reacts within a porous scaffold material. This approach can be employed to produce composite materials, for instance silicon-carbon composites, wherein a silicon-containing gas decomposes at elevated temperature within a porous carbon scaffold. General approaches in this regard have been described in the art, for example U.S. Pat. Nos. 10,454,103 and 10,147,950, the full disclosures of which are hereby incorporated by reference in their entireties for all purposes.

While this approach can be employed to manufacture a variety of composite materials, there is particular interest in silicon-carbon (Si—C) composite materials. Such Si—C composite materials have utility, for example as energy storage materials, for example as an anode material within a lithium ion battery (LIB). LIBs have potential to replace devices currently used in any number of applications. For example, current lead acid automobile batteries are not adequate for next generation all-electric and hybrid electric vehicles due to irreversible, stable sulfate formations during discharge. Lithium ion batteries are a viable alternative to the lead-based systems currently used due to their capacity, and other considerations.

To this end, there is continued strong interest in developing new LIB anode materials, particularly silicon, which has 10-fold higher gravimetric capacity than conventional graphite. However, silicon exhibits large volume change during cycling, in turn leading to electrode deterioration and solid-electrolyte interphase (SEI) instability. The most common amelioration approach is to reduce silicon particle size, for instance $D_{V50}$<150 nm, for instance $D_{V50}$<100 nm, for instance $D_{V50}$<50 nm, for instance $D_{V50}$<20 nm, for instance $D_{V50}$<10 nm, for instance $D_{V50}$<5 nm, for instance $D_{V50}$<2 nm, either as discrete particles or within a matrix. Thus far, techniques for creating nano-scale silicon involve high-temperature reduction of silicon oxide, extensive particle diminution, multi-step toxic etching, and/or other cost prohibitive processes. Likewise, common matrix approaches involve expensive materials such as graphene or nano-graphite, and/or require complex processing and coating.

It is known from scientific literature that non-graphitizable (hard) carbon is beneficial as a LIB anode material (Liu Y, Xue, J S, Zheng T, Dahn, J R. Carbon 1996, 34:193-200; Wu, Y P, Fang, S B, Jiang, Y Y. 1998, 75:201-206; Buiel E, Dahn J R. Electrochim Acta 1999 45:121-130). The basis for this improved performance stems from the disordered nature of the graphene layers that allows Li-ions to intercalate on either side of the graphene plane allowing for theoretically double the stoichiometric content of Li ions versus crystalline graphite. Furthermore, the disordered structure improves the rate capability of the material by allowing Li ions to intercalate isotropically as opposed to graphite where lithiation can only proceed in parallel to the stacked graphene planes. Despite these desirable electrochemical properties, amorphous carbons have not seen wide-spread deployment in commercial Li-ion batteries, owing primarily to low FCE and low bulk density (<1 g/cc). Instead, amorphous carbon has been used more commonly as a low-mass additive and coating for other active material components of the battery to improve conductivity and reduce surface side reactions.

In recent years, amorphous carbon as a LIB battery material has received considerable attention as a coating for silicon anode materials. Such a silicon-carbon core-shell structure has the potential for not only improving conductivity, but also buffering the expansion of silicon as it lithiates, thus stabilizing its cycle stability and minimizing problems associated with particle pulverization, isolation, and SEI integrity (Jung, Y, Lee K, Oh, S. Electrochim Acta 2007 52:7061-7067; Zuo P, Yin G, Ma Y. Electrochim Acta 2007 52:4878-4883; Ng S H, Wang J, Wexler D, Chew S Y, Liu H K. J Phys Chem C 2007 111:11131-11138). Problems associated with this strategy include the lack of a suitable silicon starting material that is amenable to the coating process, and the inherent lack of engineered void space within the carbon-coated silicon core-shell composite particle to accommodate expansion of the silicon during lithiation. This inevitably leads to cycle stability failure due to destruction of core-shell structure and SEI layer (Beattie S D, Larcher D, Morcrette M, Simon B, Tarascon, J-M. J Electrochem Soc 2008 155:A158-A163).

An alternative to core shell structure is a structure wherein amorphous, nano-sized silicon is homogenously distributed within the porosity of a porous carbon scaffold. The porous carbon allows for desirable properties: (i) carbon porosity provides void volume to accommodate the expansion of silicon during lithiation thus reducing the net composite particle expansion at the electrode level; (ii) the disordered graphene network provides increased electrical conductivity to the silicon thus enabling faster charge/discharge rates, (iii) nano-pore structure acts as a template for the synthesis of silicon thereby dictating its size, distribution, and morphology.

To this end, the desired inverse hierarchical structure can be achieved by employing CVI wherein a silicon-containing gas can completely permeate nanoporous carbon and decompose therein to nano-sized silicon. The CVI approach confers several advantages in terms of silicon structure. One advantage is that nanoporous carbon provides nucleation sites for growing silicon while dictating maximum particle shape and size. Confining the growth of silicon within a nano-porous structure affords reduced susceptibility to cracking or pulverization and loss of contact caused by expansion. Moreover, this structure promotes nano-sized silicon to remain as amorphous phase. This property provides the opportunity for high charge/discharge rates, particularly in combination with silicon's vicinity within the conductive carbon scaffold. This system provides a high-rate-capable, solid-state lithium diffusion pathway that directly delivers lithium ions to the nano-scale silicon interface. Another benefit of the silicon provide via CVI within the carbon scaffold is the inhibition of formation of undesirable crystalline $Li_{15}Si_4$ phase. Yet another benefit is that the CVI process provides for void space within the particle interior.

In order to realize such benefits commercially, various barriers must be overcome. As such, key challenges are the gas-solid boundary (i.e., achieving sufficient gas-solid contact to promote the CVI reaction), heat transfer in the porous scaffold (i.e., achieving sufficient level and uniformity of temperature to promote the CVI reaction), elutriation of the particulate porous scaffold, and flowability and processability of the porous scaffold.

Therefore, the need remains in the art for easily scalable, inexpensive, and improved processes for producing composite materials employing CVI. Embodiments of the disclosed invention meet this need, and provide further related advantages.

BRIEF SUMMARY

In general terms, embodiments of the current invention are directed to manufacturing composite materials, for example Si—C composite materials via vibro-thermally assisted chemical vapor infiltration (VTA-CVI). The VTA-CVI process overcomes various challenges posed by conventional CVI methodologies. For instance, VTA-CVI provides for uniform heating of the porous carbon scaffold particles since individual particles have the opportunity over the course of the reaction time to both be in contact with the heated, vibrating surface, as well be dispersed within the silicon-containing gas phase. In this fashion, both conductive and convective heat transfer can be accomplished and balanced for the plurality of the porous carbon scaffold particles. In this fashion, VTA-CVI facilitates access of the silicon-containing gas directly to within the carbon scaffold porosity, which would otherwise by limited for a packed bed CVI approach. VTA-CVI also provides for conveyance of the reacting porous carbon scaffold particles, facilitating continuous processing. Surprisingly, we have found that the ability to employ vibration to satisfactorily disperse the reacting porous carbon scaffold particles is profoundly dependent on temperature. Thus, the current invention claims specific combinations of processes parameters (e.g., vibration, temperature, etc.) and porous particle properties (e.g., particle size, total pore volume, and pore volume distribution) that overcomes the challenges associated with previous technologies.

DETAILED DESCRIPTION

Figure 1:
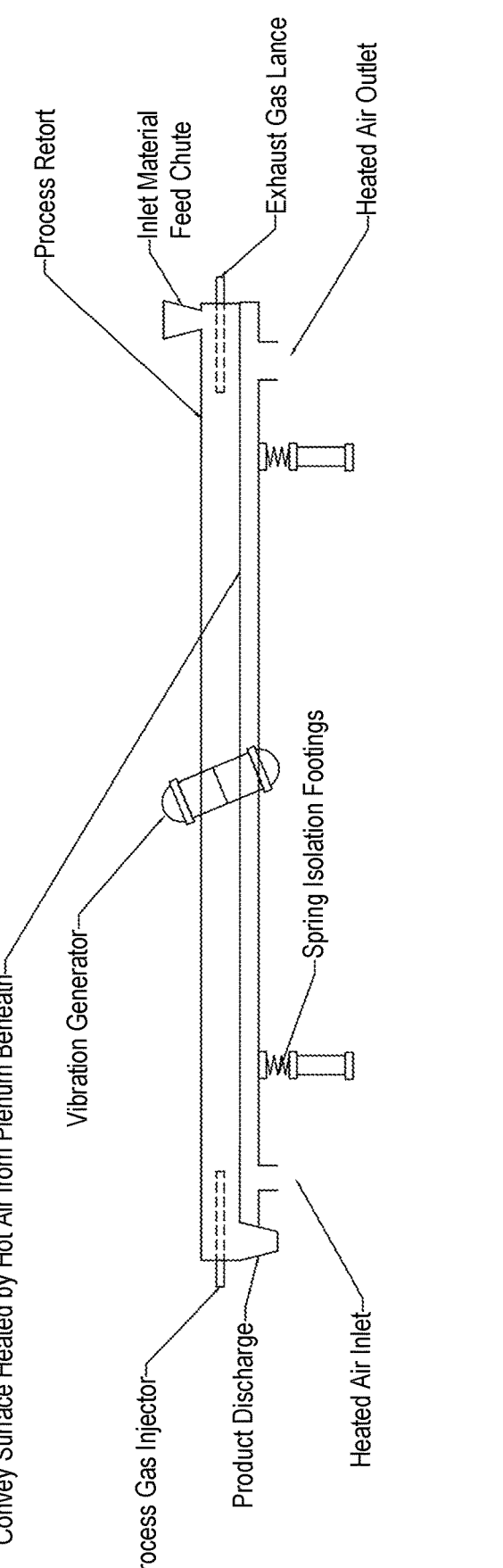
FIG. 1. Schematic of VTA-CVI reactor comprising a heated air plenum.

In the following description, certain specific details are set forth in order to provide a thorough understanding of various embodiments. However, one skilled in the art will understand that the invention may be practiced without these details. In other instances, well-known structures have not been shown or described in detail to avoid unnecessarily obscuring descriptions of the embodiments. Unless the context requires otherwise, throughout the specification and claims which follow, the word "comprise" and variations thereof, such as, "comprises" and "comprising" are to be construed in an open, inclusive sense, that is, as "including, but not limited to." Further, headings provided herein are for convenience only and do not interpret the scope or meaning of the claimed invention.

Reference throughout this specification to "one embodiment" or "an embodiment" means that a particular feature, structure or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments. Also, as used in this specification and the appended claims, the singular forms "a," "an," and "the" include plural referents unless the content clearly dictates otherwise. It should also be noted that the term "or" is generally employed in its sense including "and/or" unless the content clearly dictates otherwise.

A. Porous Scaffold Materials

For the purposes of embodiments of the current invention, a porous scaffold may be used, into which silicon is to be impregnated. In this context, the porous scaffold can comprise various materials. In some embodiments the porous scaffold material primarily comprises carbon, for example hard carbon. Other allotropes of carbon are also envisioned in other embodiments, for example, graphite, amorphous carbon, diamond, C60, carbon nanotubes (e.g., single and/or multi-walled), graphene and/or carbon fibers. The introduction of porosity into the carbon material can be achieved by a variety of means. For instance, the porosity in the carbon material can be achieved by modulation of polymer precursors, and/or processing conditions to create said porous carbon material, and described in detail in the subsequent section.

In other embodiments, the porous scaffold comprises a polymer material. To this end, a wide variety of polymers are envisioned in various embodiments to have utility, including, but not limited to, inorganic polymer, organic polymers, and addition polymers. Examples of inorganic polymers in this context includes, but are not limited to homochain polymers of silicon-silicon such as polysilanes, silicon carbide, polygermanes, and polystannanes. Additional examples of inorganic polymers includes, but are not limited to, heterochain polymers such as polyborazylenes, polysiloxanes like polydimethylsiloxane (PDMS), polymethylhydrosiloxane (PMHS) and polydiphenylsiloxane, polysilazanes like perhydridopolysilazane (PHPS), polyphosphazenes and poly(dichlorophosphazenes), polyphosphates, polythiazyls, and polysulfides. Examples of organic polymers includes, but are not limited to, low density polyethylene (LDPE), high density polyethylene (HDPE), polypropylene (PP), polyvinyl chloride (PVC), polystyrene (PS), nylon, nylon 6, nylon 6,6, teflon (Polytetrafluoroethylene), thermoplastic polyurethanes (TPU), polyureas, poly(lactide), poly(glycolide) and combinations thereof, phenolic resins, polyamides, polyaramids, polyethylene terephthalate, polychloroprene, polyacrylonitrile, polyaniline, polyimide, poly(3,4-ethylenedioxythiophene) polystyrene sulfonate (PDOT:PSS), and others known in the arts. The organic polymer can be synthetic or natural in origin. In some embodiments, the polymer is a polysaccharide, such as starch, cellulose, cellobiose, amylose, amylpectin, gum Arabic, lignin, and the like. In some embodiments, the polysaccharide is derived from the carmelization of mono- or oligomeric sugars, such as fructose, glucose, sucrose, maltose, raffinose, and the like.

In certain embodiments, the porous scaffold polymer material comprises a coordination polymer. Coordination polymers in this context include, but not limited to, metal organic frameworks (MOFs). Techniques for production of MOFs, as well as exemplary species of MOFs, are known and described in the art ("The Chemistry and Applications of Metal-Organic Frameworks, Hiroyasu Furukawa et al. Science 341, (2013); DOI: 10.1126/science.1230444). Examples of MOFs in the context include, but are not limited to, Basolite™ materials and zeolitic imidazolate frameworks (ZIFs).

Concomitant with the myriad variety of polymers envisioned with the potential to provide a porous substrate, various processing approaches are envisioned in various embodiments to achieve said porosity. In this context, general methods for imparting porosity into various materials are myriad, as known in the art, including, but certainly not limited to, methods involving emulsification, micelle creation, gasification, dissolution followed by solvent removal (for example, lyophilization), axial compaction and sintering, gravity sintering, powder rolling and sintering, isostatic compaction and sintering, metal spraying, metal coating and sintering, metal injection molding and sintering, and the like. Other approaches to create a porous polymeric material, including creation of a porous gel, such as a freeze dried gel, aerogel, and the like are also envisioned.

In certain embodiments, the porous scaffold material comprises a porous ceramic material. In certain embodiments, the porous scaffold material comprises a porous ceramic foam. In this context, general methods for imparting porosity into ceramic materials are varied, as known in the art, including, but certainly not limited to, creation of porous In this context, general methods and materials suitable for comprising the porous ceramic include, but are not limited to, porous aluminum oxide, porous zirconia toughened alumina, porous partially stabilized zirconia, porous alumina, porous sintered silicon carbide, sintered silicon nitride, porous cordierite, porous zirconium oxide, clay-bound silicon carbide, and the like.

In certain embodiments, the porous scaffold comprises porous silica or other silicon material containing oxygen. The creation of silicon gels, including sol gels, and other porous silica materials is known in the art.

In certain embodiments, the porous material comprises a porous metal. Suitable metals in this regard include, but are not limited to porous aluminum, porous steel, porous nickel, porous Inconcel, porous Hasteloy, porous titanium, porous copper, porous brass, porous gold, porous silver, porous germanium, and other metals capable of being formed into porous structures, as known in the art. In some embodiments, the porous scaffold material comprises a porous metal foam. The types of metals and methods to manufacture related to same are known in the art. Such methods include, but are not limited to, casting (including foaming, infiltration, and lost-foam casting), deposition (chemical and physical), gas-eutectic formation, and powder metallurgy techniques (such as powder sintering, compaction in the presence of a foaming agent, and fiber metallurgy techniques).

B. Porous Carbon Scaffold

Methods for preparing porous carbon materials from polymer precursors are known in the art. For example, methods for preparation of carbon materials are described in U.S. Pat. Nos. 7,723,262, 8,293,818, 8,404,384, 8,654,507, 8,916,296, 9,269,502, 10,590,277, and U.S. patent application Ser. No. 16/745,197, the full disclosures of which are hereby incorporated by reference in their entireties for all purposes.

Accordingly, in one embodiment the present disclosure provides a method for preparing any of the carbon materials or polymer gels described above. The carbon materials may be synthesized through pyrolysis of either a single precursor, for example a saccharide material such as sucrose, fructose, glucose, dextrin, maltodextrin, starch, amylopectin, amlyose, lignin, gum Arabic, and other saccharides known in the art, and combinations thereof. Alternatively, the carbon materials may be synthesized through pyrolysis of a complex resin, for instance formed using a sol-gel method using polymer precursors such as phenol, resorcinol, bisphenol A, urea, melamine, and other suitable compounds known in the art, and combinations thereof, in a suitable solvent such as water, ethanol, methanol, and other solvents known in the art, and combinations thereof, with cross-linking agents such as formaldehyde, hexamethylenetetramine, furfural, and other cross-lining agents known in the art, and combinations thereof. The resin may be acid or basic, and may contain a catalyst. The catalyst may be volatile or non-volatile. The pyrolysis temperature and dwell time can vary as known in the art.

In some embodiments, the methods comprise preparation of a polymer gel by a sol gel process, condensation process or crosslinking process involving monomer precursor(s) and a crosslinking agent, two existing polymers and a crosslinking agent or a single polymer and a crosslinking agent, followed by pyrolysis of the polymer gel. The polymer gel may be dried (e.g., freeze dried) prior to pyrolysis; however drying is not necessarily required.

The target carbon properties can be derived from a variety of polymer chemistries provided the polymerization reaction produces a resin/polymer with the necessary carbon backbone. Different polymer families include novolacs, resoles, acrylates, styrenics, ureathanes, rubbers (neoprenes, styrene-butadienes, etc.), nylons, etc. The preparation of any of these polymer resins can occur via a number of different processes including sol gel, emulsion/suspension, solid state, solution state, melt state, etc for either polymerization and crosslinking processes.

In some embodiments an electrochemical modifier is incorporated into the material as polymer. For example, the organic or carbon containing polymer, RF for example, is copolymerized with the polymer, which contains the electrochemical modifier. In one embodiment, the electrochemical modifier-containing polymer contains silicon. In one embodiment the polymer is tetraethylorthosiliane (TEOS). In one embodiment, a TEOS solution is added to the RF solution prior to or during polymerization. In another embodiment the polymer is a polysilane with organic side groups. In some cases these side groups are methyl groups, in other cases these groups are phenyl groups, in other cases the side chains include phenyl, pyrol, acetate, vinyl, siloxane fragments. In some cases the side chain includes a group 14 element (silicon, germanium, tin or lead). In other cases the side chain includes a group 13 element (boron, aluminum, boron, gallium, indium). In other cases the side chain includes a group 15 element (nitrogen, phosphorous, arsenic). In other cases the side chain includes a group 16 element (oxygen, sulfur, selenium).

In another embodiment the electrochemical modifier comprises a silole. In some cases it is a phenol-silole or a silaflourene. In other cases it is a poly-silole or a poly-silaflourene. In some cases the silicon is replaced with germanium (germole or germaflourene), tin (stannole or stannaflourene) nitrogen (carbazole) or phosphorous (phosphole, phosphafluorene). In all cases the heteroatom containing material can be a small molecule, an oligomer or a polymer. Phosphorous atoms may or may not be also bonded to oxygen.

In some embodiments the reactant comprises phosphorous. In certain other embodiments, the phosphorus is in the form of phosphoric acid. In certain other embodiments, the phosphorus can be in the form of a salt, wherein the anion of the salt comprises one or more phosphate, phosphite, phosphide, hydrogen phosphate, dihydrogen phosphate, hexafluorophosphate, hypophosphite, polyphosphate, or pyrophosphate ions, or combinations thereof. In certain other embodiments, the phosphorus can be in the form of a salt, wherein the cation of the salt comprises one or more phosphonium ions. The non-phosphate containing anion or cation pair for any of the above embodiments can be chosen for those known and described in the art. In the context, exemplary cations to pair with phosphate-containing anions include, but are not limited to, ammonium, tetraethylammonium, and tetramethylammonium ions. In the context, exemplary anions to pair with phosphate-containing cations include, but are not limited to, carbonate, dicarbonate, and acetate ions.

In some embodiments, the catalyst comprises a basic volatile catalyst. For example, in one embodiment, the basic volatile catalyst comprises ammonium carbonate, ammonium bicarbonate, ammonium acetate, ammonium hydroxide, or combinations thereof. In a further embodiment, the basic volatile catalyst is ammonium carbonate. In another further embodiment, the basic volatile catalyst is ammonium acetate.

In still other embodiments, the method comprises admixing an acid. In certain embodiments, the acid is a solid at room temperature and pressure. In some embodiments, the acid is a liquid at room temperature and pressure. In some embodiments, the acid is a liquid at room temperature and pressure that does not provide dissolution of one or more of the other polymer precursors.

The acid may be selected from any number of acids suitable for the polymerization process. For example, in some embodiments the acid is acetic acid and in other embodiments the acid is oxalic acid. In further embodiments, the acid is mixed with the first or second solvent in a ratio of acid to solvent of 99:1, 90:10, 75:25, 50:50, 25:75, 20:80, 10:90 or 1:90. In other embodiments, the acid is acetic acid and the first or second solvent is water. In other embodiments, acidity is provided by adding a solid acid.

The total content of acid in the mixture can be varied to alter the properties of the final product. In some embodiments, the acid is present from about 1% to about 50% by weight of mixture. In other embodiments, the acid is present from about 5% to about 25%. In other embodiments, the acid is present from about 10% to about 20%, for example about 10%, about 15% or about 20%.

In certain embodiments, the polymer precursor components are blended together and subsequently held for a time and at a temperature sufficient to achieve polymerization. One or more of the polymer precursor components can have particle size less than about 20 mm in size, for example less than 10 mm, for example less than 7 mm, for example, less than 5 mm, for example less than 2 mm, for example less than 1 mm, for example less than 100 microns, for example less than 10 microns. In some embodiments, the particle size of one or more of the polymer precursor components is reduced during the blending process.

The blending of one or more polymer precursor components in the absence of solvent can be accomplished by methods described in the art, for example ball milling, jet milling, Fritsch milling, planetary mixing, and other mixing methodologies for mixing or blending solid particles while controlling the process conditions (e.g., temperature). The mixing or blending process can be accomplished before, during, and/or after (or combinations thereof) incubation at the reaction temperature.

Reaction parameters include aging the blended mixture at a temperature and for a time sufficient for the one or more polymer precursors to react with each other and form a polymer. In this respect, suitable aging temperature ranges from about room temperature to temperatures at or near the melting point of one or more of the polymer precursors. In some embodiments, suitable aging temperature ranges from about room temperature to temperatures at or near the glass transition temperature of one or more of the polymer precursors. For example, in some embodiments the solvent free mixture is aged at temperatures from about 20° C. to about 600° C., for example about 20° C. to about 500° C., for example about 20° C. to about 400° C., for example about 20° C. to about 300° C., for example about 20° C. to about 200° C. In certain embodiments, the solvent free mixture is aged at temperatures from about 50 to about 250° C.

The reaction duration is generally sufficient to allow the polymer precursors to react and form a polymer, for example the mixture may be aged anywhere from 1 hour to 48 hours, or more or less depending on the desired result. Typical embodiments include aging for a period of time ranging from about 2 hours to about 48 hours, for example in some embodiments aging comprises about 12 hours and in other embodiments aging comprises about 4-8 hours (e.g., about 6 hours).

In certain embodiments, an electrochemical modifier is incorporated during the above described polymerization process. For example, in some embodiments, an electrochemical modifier in the form of metal particles, metal paste, metal salt, metal oxide or molten metal can be dissolved or suspended into the mixture from which the gel resin is produced Exemplary electrochemical modifiers for producing composite materials may fall into one or more than one of the chemical classifications. In some embodiments, the electrochemical modifier is a lithium salt, for example, but not limited to, lithium fluoride, lithium chloride, lithium carbonate, lithium hydroxide, lithium benzoate, lithium bromide, lithium formate, lithium hexafluorophosphate, lithium iodate, lithium iodide, lithium perchlorate, lithium phosphate, lithium sulfate, lithium tetraborate, lithium tetrafluo-roborate, and combinations thereof.

In certain embodiments, the electrochemical modifier comprises a metal, and exemplary species includes, but are not limited to aluminum isoproproxide, manganese acetate, nickel acetate, iron acetate, tin chloride, silicon chloride, and combinations thereof. In certain embodiments, the electro-chemical modifier is a phosphate compound, including but not limited to phytic acid, phosphoric acid, ammonium dihydrogenphosphate, and combinations thereof. In certain embodiments, the electrochemical modifier comprises sili-con, and exemplary species includes, but are not limited to silicon powders, silicon nanotubes, polycrystalline silicon, nanocrystalline silicon, amorpohous silicon, porous silicon, nano sized silicon, nano-featured silicon, nano-sized and nano-featured silicon, silicyne, and black silicon, and com-binations thereof.

Electrochemical modifiers can be combined with a variety of polymer systems through either physical mixing or chemical reactions with latent (or secondary) polymer func-tionality. Examples of latent polymer functionality include, but are not limited to, epoxide groups, unsaturation (double and triple bonds), acid groups, alcohol groups, amine groups, basic groups. Crosslinking with latent functionality can occur via heteroatoms (e.g. vulcanization with sulfur, acid/base/ring opening reactions with phosphoric acid), reactions with organic acids or bases (described above), coordination to transition metals (including but not limited to Ti, Cr, Mn, Fe, Co, Ni, Cu, Zn, Zr, Nb, Mo, Ag, Au), ring opening or ring closing reactions (rotaxanes, spiro com-pounds, etc).

Electrochemical modifiers can also be added to the poly-mer system through physical blending. Physical blending can include but is not limited to melt blending of polymers and/or co-polymers, the inclusion of discrete particles, chemical vapor deposition of the electrochemical modifier and coprecipitation of the electrochemical modifier and the main polymer material.

In some instances the electrochemical modifier can be added via a metal salt solid, solution, or suspension. The metal salt solid, solution or suspension may comprise acids and/or alcohols to improve solubility of the metal salt. In yet another variation, the polymer gel (either before or after an optional drying step) is contacted with a paste comprising the electrochemical modifier. In yet another variation, the polymer gel (either before or after an optional drying step) is contacted with a metal or metal oxide sol comprising the desired electrochemical modifier.

In addition to the above exemplified electrochemical modifiers, the composite materials may comprise one or more additional forms (i.e., allotropes) of carbon. In this regard, it has been found that inclusion of different allo-tropes of carbon such as graphite, amorphous carbon, con-ductive carbon, carbon black, diamond, C60, carbon nano-tubes (e.g., single and/or multi-walled), graphene and/or carbon fibers into the composite materials is effective to optimize the electrochemical properties of the composite materials. The various allotropes of carbon can be incorpo-rated into the carbon materials during any stage of the preparation process described herein. For example, during the solution phase, during the gelation phase, during the curing phase, during the pyrolysis phase, during the milling phase, or after milling. In some embodiments, the second carbon form is incorporated into the composite material by adding the second carbon form before or during polymer-ization of the polymer gel as described in more detail herein. The polymerized polymer gel containing the second carbon form is then processed according to the general techniques described herein to obtain a carbon material containing a second allotrope of carbon.

In a preferred embodiment, the carbon is produced from precursors with little or no solvent required for processing (solvent free). The structure of the polymer precursors suitable for use in a low solvent or essentially solvent free reaction mixture is not particularly limited, provided that the polymer precursor is capable of reacting with another poly-mer precursor or with a second polymer precursor to form a polymer. Polymer precursors include amine-containing compounds, alcohol-containing compounds and carbonyl-containing compounds, for example in some embodiments the polymer precursors are selected from an alcohol, a phenol, a polyalcohol, a sugar, an alkyl amine, an aromatic amine, an aldehyde, a ketone, a carboxylic acid, an ester, a urea, an acid halide and an isocyanate.

In one embodiment employing a low or essentially sol-vent free reaction mixture, the method comprises use of a first and second polymer precursor, and in some embodi-ments the first or second polymer precursor is a carbonyl containing compound and the other of the first or second polymer precursor is an alcohol containing compound. In some embodiments, a first polymer precursor is a phenolic compound and a second polymer precursor is an aldehyde compound (e.g., formaldehyde). In one embodiment, of the method the phenolic compound is phenol, resorcinol, cat-echol, hydroquinone, phloroglucinol, or a combination thereof; and the aldehyde compound is formaldehyde, acet-aldehyde, propionaldehyde, butyraldehyde, benzaldehyde, cinnamaldehyde, or a combination thereof. In a further embodiment, the phenolic compound is resorcinol, phenol or a combination thereof, and the aldehyde compound is form-aldehyde. In yet further embodiments, the phenolic com-pound is resorcinol and the aldehyde compound is formal-dehyde. In some embodiments, the polymer precursors are alcohols and carbonyl compounds (e.g., resorcinol and alde-hyde) and they are present in a ratio of about 0.5:1.0, respectively.

The polymer precursor materials suitable for low or essentially solvent free reaction mixture as disclosed herein include (a) alcohols, phenolic compounds, and other mono- or polyhydroxy compounds and (b) aldehydes, ketones, and combinations thereof. Representative alcohols in this con-text include straight chain and branched, saturated and unsaturated alcohols. Suitable phenolic compounds include polyhydroxy benzene, such as a dihydroxy or trihydroxy benzene. Representative polyhydroxy benzenes include resorcinol (i.e., 1,3-dihydroxy benzene), catechol, hydroqui-none, and phloroglucinol. Other suitable compounds in this regard are bisphenols, for instance, bisphenol A. Mixtures of two or more polyhydroxy benzenes can also be used. Phenol (monohydroxy benzene) can also be used. Representative polyhydroxy compounds include sugars, such as glucose, sucrose, fructose, chitin and other polyols, such as mannitol. Aldehydes in this context include: straight chain saturated aldeydes such as methanal (formaldehyde), ethanal (acetal-dehyde), propanal (propionaldehyde), butanal (butyralde-hyde), and the like; straight chain unsaturated aldehydes such as ethenone and other ketenes, 2-propenal (acrylalde-hyde), 2-butenal (crotonaldehyde), 3 butenal, and the like; branched saturated and unsaturated aldehydes; and aro-matic-type aldehydes such as benzaldehyde, salicylalde-hyde, hydrocinnamaldehyde, and the like. Suitable ketones include: straight chain saturated ketones such as propanone and 2 butanone, and the like; straight chain unsaturated ketones such as propenone, 2 butenone, and 3 butenone (methyl vinyl ketone) and the like; branched saturated and unsaturated ketones; and aromatic-type ketones such as methyl benzyl ketone (phenylacetone), ethyl benzyl ketone, and the like. The polymer precursor materials can also be combinations of the precursors described above.

In some embodiments, one polymer precursor in the low or essentially solvent free reaction mixture is an alcohol-containing species and another polymer precursor is a carbonyl-containing species. The relative amounts of alcohol-containing species (e.g., alcohols, phenolic compounds and mono- or poly-hydroxy compounds or combinations thereof) reacted with the carbonyl containing species (e.g. aldehydes, ketones or combinations thereof) can vary substantially. In some embodiments, the ratio of alcohol-containing species to aldehyde species is selected so that the total moles of reactive alcohol groups in the alcohol-containing species is approximately the same as the total moles of reactive carbonyl groups in the aldehyde species. Similarly, the ratio of alcohol-containing species to ketone species may be selected so that the total moles of reactive alcohol groups in the alcohol containing species is approximately the same as the total moles of reactive carbonyl groups in the ketone species. The same general 1:1 molar ratio holds true when the carbonyl-containing species comprises a combination of an aldehyde species and a ketone species.

In other embodiments, the polymer precursor in the low or essentially solvent free reaction mixture is a urea or an amine containing compound. For example, in some embodiments the polymer precursor is urea, melamine, hexamethylenetetramine (HMT) or combination thereof. Other embodiments include polymer precursors selected from isocyanates or other activated carbonyl compounds such as acid halides and the like.

Some embodiments of the disclosed methods include preparation of low or solvent-free polymer gels (and carbon materials) comprising electrochemical modifiers. Such electrochemical modifiers include, but are not limited to nitrogen, silicon, and sulfur. In other embodiments, the electrochemical modifier comprises fluorine, iron, tin, silicon, nickel, aluminum, zinc, or manganese. The electrochemical modifier can be included in the preparation procedure at any step. For example, in some the electrochemical modifier is admixed with the mixture, the polymer phase or the continuous phase.

The blending of one or more polymer precursor components in the absence of solvent can be accomplished by methods described in the art, for example ball milling, jet milling, Fritsch milling, planetary mixing, and other mixing methodologies for mixing or blending solid particles while controlling the process conditions (e.g., temperature). The mixing or blending process can be accomplished before, during, and/or after (or combinations thereof) incubation at the reaction temperature.

Reaction parameters include aging the blended mixture at a temperature and for a time sufficient for the one or more polymer precursors to react with each other and form a polymer. In this respect, suitable aging temperature ranges from about room temperature to temperatures at or near the melting point of one or more of the polymer precursors. In some embodiments, suitable aging temperature ranges from about room temperature to temperatures at or near the glass transition temperature of one or more of the polymer precursors. For example, in some embodiments the solvent free mixture is aged at temperatures from about 20° C. to about 600° C., for example about 20° C. to about 500° C., for example about 20° C. to about 400° C., for example about 20° C. to about 300° C., for example about 20° C. to about 200° C. In certain embodiments, the solvent free mixture is aged at temperatures from about 50 to about 250° C.

The porous carbon material can be achieved via pyrolysis of a polymer produced from precursors materials as described above. In some embodiments, the porous carbon material comprises an amorphous activated carbon that is produced by pyrolysis, physical or chemical activation, or combination thereof in either a single process step or sequential process steps.

The temperature and dwell time of pyrolysis can be varied, for example the dwell time van vary from 1 min to 10 min, from 10 min to 30 min, from 30 min to 1 hour, for 1 hour to 2 hours, from 2 hours to 4 hours, from 4 hours to 24 h. The temperature can be varied, for example, the pyrolysis temperature can vary from 200 to 300 C, from 250 to 350 C, from 350 C to 450 C, from 450 C to 550 C, from 540 C to 650 C, from 650 C to 750 C, from 750 C to 850 C, from 850 C to 950 C, from 950 C to 1050 C, from 1050 C to 1150 C, from 1150 C to 1250 C. The pyrolysis can be accomplished in an inert gas, for example nitrogen, or argon.

In some embodiments, an alternate gas is used to further accomplish carbon activation. In certain embodiments, pyrolysis and activation are combined. Suitable gases for accomplishing carbon activation include, but are not limited to, carbon dioxide, carbon monoxide, water (steam), air, oxygen, and further combinations thereof. The temperature and dwell time of activation can be varied, for example the dwell time van vary from 1 min to 10 min, from 10 min to 30 min, from 30 min to 1 hour, for 1 hour to 2 hours, from 2 hours to 4 hours, from 4 hours to 24 h. The temperature can be varied, for example, the pyrolysis temperature can vary from 200 to 300 C, from 250 to 350 C, from 350 C to 450 C, from 450 C to 550 C, from 540 C to 650 C, from 650 C to 750 C, from 750 C to 850 C, from 850 C to 950 C, from 950 C to 1050 C, from 1050 C to 1150 C, from 1150 C to 1250 C.

Either prior to the pyrolysis, and/or after pyrolysis, and/or after activation, the carbon may be subjected to a particle size reduction. The particle size reduction can be accomplished by a variety of techniques known in the art, for example by jet milling in the presence of various gases including air, nitrogen, argon, helium, supercritical steam, and other gases known in the art. Other particle size reduction methods, such as grinding, ball milling, jet milling, water jet milling, and other approaches known in the art are also envisioned.

The porous carbon scaffold may be in the form of particles. The particle size and particle size distribution can be measured by a variety of techniques known in the art, and can be described based on fractional volume. In this regard, the Dv50 of the carbon scaffold may be between 10 nm and 10 mm, for example between 100 nm and 1 mm, for example between 1 um and 100 um, for example between 2 um and 50 um, example between 3 um and 30 um, example between 4 um and 20 um, example between 5 um and 10 um. In certain embodiments, the Dv50 is less than 1 mm, for example less than 100 um, for example less than 50 um, for example less than 30 um, for example less than 20 um, for example less than 10 um, for example less than 8 um, for example less than 5 um, for example less than 3 um, for example less than 1 um. In certain embodiments, the Dv100 is less than 1 mm, for example less than 100 um, for example less than 50 um, for example less than 30 um, for example less than 20 um, for example less than 10 um, for example less than 8 um, for example less than 5 um, for example less than 3 um, for example less than 1 um. In certain embodiments, the Dv99 is less than 1 mm, for example less than 100 um, for example less than 50 um, for example less than 30 um, for example less than 20 um, for example less than 10 um, for example less than 8 um, for example less than 5 um, for example less than 3 um, for example less than 1 um. In certain embodiments, the Dv90 is less than 1 mm, for example less than 100 um, for example less than 50 um, for example less than 30 um, for example less than 20 um, for example less than 10 um, for example less than 8 um, for example less than 5 um, for example less than 3 um, for example less than 1 um. In certain embodiments, the Dv0 is greater than 10 nm, for example greater than 100 nm, for example greater than 500 nm, for example greater than 1 um, for example greater than 2 um, for example greater than 5 um, for example greater than 10 um. In certain embodiments, the Dv1 is greater than 10 nm, for example greater than 100 nm, for example greater than 500 nm, for example greater than 1 um, for example greater than 2 um, for example greater than 5 um, for example greater than 10 um. In certain embodiments, the Dv10 is greater than 10 nm, for example greater than 100 nm, for example greater than 500 nm, for example greater than 1 um, for example greater than 2 um, for example greater than 5 um, for example greater than 10 um.

In some embodiments, the surface area of the porous carbon scaffold can comprise a surface area greater than 400 m2/g, for example greater than 500 m2/g, for example greater than 750 m2/g, for example greater than 1000 m2/g, for example greater than 1250 m2/g, for example greater than 1500 m2/g, for example greater than 1750 m2/g, for example greater than 2000 m2/g, for example greater than 2500 m2/g, for example greater than 3000 m2/g. In other embodiments, the surface area of the porous carbon scaffold can be less than 500 m2/g. In some embodiments, the surface area of the porous carbon scaffold is between 200 and 500 m2/g. In some embodiments, the surface area of the porous carbon scaffold is between 100 and 200 m2/g. In some embodiments, the surface area of the porous carbon scaffold is between 50 and 100 m2/g. In some embodiments, the surface area of the porous carbon scaffold is between 10 and 50 m2/g. In some embodiments, the surface area of the porous carbon scaffold can be less than 10 m2/g.

In some embodiments, the pore volume of the porous carbon scaffold is greater than 0.4 cm3/g, for example greater than 0.5 cm3/g, for example greater than 0.6 cm3/g, for example greater than 0.7 cm3/g, for example greater than 0.8 cm3/g, for example greater than 0.9 cm3/g, for example greater than 1.0 cm3/g, for example greater than 1.1 cm3/g, for example greater than 1.2 cm3/g, for example greater than 1.4 cm3/g, for example greater than 1.6 cm3/g, for example greater than 1.8 cm3/g, for example greater than 2.0 cm3/g. In other embodiments, the pore volume of the porous silicon scaffold is less than 0.5 cm3, for example between 0.1 cm3/g and 0.5 cm3/g. In certain other embodiments, the pore volume of the porous silicon scaffold is between 0.01 cm3/g and 0.1 cm3/g.

In some other embodiments, the porous carbon scaffold is an amorphous activated carbon with a pore volume between 0.2 and 2.0 cm3/g. In certain embodiments, the carbon is an amorphous activated carbon with a pore volume between 0.4 and 1.5 cm3/g. In certain embodiments, the carbon is an amorphous activated carbon with a pore volume between 0.5 and 1.2 cm3/g. In certain embodiments, the carbon is an amorphous activated carbon with a pore volume between 0.6 and 1.0 cm3/g.

In some other embodiments, the porous carbon scaffold comprises a tap density of less than 1.0 g/cm3, for example less than 0.8 g/cm3, for example less than 0.6 g/cm3, for example less than 0.5 g/cm3, for example less than 0.4 g/cm3, for example less than 0.3 g/cm3, for example less than 0.2 g/cm3, for example less than 0.1 g/cm3.

The surface functionality of the porous carbon scaffold can vary. One property which can be predictive of surface functionality is the pH of the porous carbon scaffold. The presently disclosed porous carbon scaffolds comprise pH values ranging from less than 1 to about 14, for example less than 5, from 5 to 8 or greater than 8. In some embodiments, the pH of the porous carbon is less than 4, less than 3, less than 2 or even less than 1. In other embodiments, the pH of the porous carbon is between about 5 and 6, between about 6 and 7, between about 7 and 8 or between 8 and 9 or between 9 and 10. In still other embodiments, the pH is high and the pH of the porous carbon ranges is greater than 8, greater than 9, greater than 10, greater than 11, greater than 12, or even greater than 13.

The pore volume distribution of the porous carbon scaffold can vary. For example, the % micropores can comprise less than 30%, for example less than 20%, for example less than 10%, for example less than 5%, for example less than 4%, for example less than 3%, for example less than 2%, for example less than 1%, for example less than 0.5%, for example less than 0.2%, for example, less than 0.1%. In certain embodiments, there is no detectable micropore volume in the porous carbon scaffold.

The mesopores comprising the porous carbon scaffold can vary. For example, the % mesopores can comprise less than 30%, for example less than 20%, for example less than 10%, for example less than 5%, for example less than 4%, for example less than 3%, for example less than 2%, for example less than 1%, for example less than 0.5%, for example less than 0.2%, for example, less than 0.1%. In certain embodiments, there is no detectable mesopore volume in the porous carbon scaffold.

In some embodiments, the pore volume distribution of the porous carbon scaffold comprises more than 50% macropores, for example more than 60% macropores, for example more than 70% macropores, for example more than 80% macropores, for example more than 90% macropores, for example more than 95% macropores, for example more than 98% macropores, for example more than 99% macropores, for example more than 99.5% macropores, for example more than 99.9% macropores.

In certain preferred embodiments, the pore volume of the porous carbon scaffold comprises a blend of micropores, mesopores, and macropores. Accordingly, in certain embodiments, the porous carbon scaffold comprises 0-20% micropores, 30-70% mesopores, and less than 10% macropores. In certain other embodiments, the porous carbon scaffold comprises 0-20% micropores, 0-20% mesopores, and 70-95% macropores. In certain other embodiments, the porous carbon scaffold comprises 20-50% micropores, 50-80% mesopores, and 0-10% macropores. In certain other embodiments, the porous carbon scaffold comprises 40-60% micropores, 40-60% mesopores, and 0-10% macropores. In certain other embodiments, the porous carbon scaffold comprises 80-95% micropores, 0-10% mesopores, and 0-10% macropores. In certain other embodiments, the porous carbon scaffold comprises 0-10% micropores, 30-50% mesopores, and 50-70% macropores. In certain other embodiments, the porous carbon scaffold comprises 0-10% micropores, 70-80% mesopores, and 0-20% macropores. In certain other embodiments, the porous carbon scaffold comprises 0-20% micropores, 70-95% mesopores, and 0-10% macropores. In certain other embodiments, the porous carbon scaffold comprises 0-10% micropores, 70-95% mesopores, and 0-20% macropores.

In certain embodiments, the % of pore volume in the porous carbon scaffold representing pores between 100 and 1000 A (10 and 100 nm) comprises greater than 30% of the total pore volume, for example greater than 40% of the total pore volume, for example greater than 50% of the total pore volume, for example greater than 60% of the total pore volume, for example greater than 70% of the total pore volume, for example greater than 80% of the total pore volume, for example greater than 90% of the total pore volume, for example greater than 95% of the total pore volume, for example greater than 98% of the total pore volume, for example greater than 99% of the total pore volume, for example greater than 99.5% of the total pore volume, for example greater than 99.9% of the total pore volume.

In certain embodiments, the skeletal density of the porous carbon scaffold ranges from about 1 g/cc to about 3 g/cc, for example from about 1.5 g/cc to about 2.3 g/cc. In other embodiments, the skeletal density ranges from about 1.5 cc/g to about 1.6 cc/g, from about 1.6 cc/g to about 1.7 cc/g, from about 1.7 cc/g to about 1.8 cc/g, from about 1.8 cc/g to about 1.9 cc/g, from about 1.9 cc/g to about 2.0 cc/g, from about 2.0 cc/g to about 2.1 cc/g, from about 2.1 cc/g to about 2.2 cc/g or from about 2.2 cc/g to about 2.3 cc/g, from about 2.3 cc to about 2.4 cc/g, for example from about 2.4 cc/g to about 2.5 cc/g.

C. Vibro-Thermally Assisted Chemical Vapor Infiltration (VTA-CVI)

One traditional approach to creating a composite material is to subject a substrate material to elevated temperature in the presence of a thermally decomposing gas. For example, a related process known in the art is chemical vapor deposition (CVD), wherein a substrate provides a solid surface comprising the first component of the composite, and the gas thermally decomposes on this solid surface to provide the second component of composite. Such a CVD approach can be employed, for instance, to create Si—C composite materials wherein the silicon is coating on the outside surface of silicon particles. Alternatively, chemical vapor infiltration (CVI) is a process wherein a substrate provides a porous scaffold comprising the first component of the composite, and the gas thermally decomposes on into the porosity (into the pores) of the porous scaffold material to provide the second component of composite.

In an embodiment, silicon is created within the pores of the porous carbon scaffold by subjecting the porous carbon particles to a silicon containing precursor gas at elevated temperature and the presence of a silicon-containing gas, preferably silane, in order to decompose said gas into silicon. The silicon containing precursor gas can be mixed with other inert gases, for example, nitrogen gas. The temperature and time of processing can be varied, for example the temperature can be between 200 and 900 C, for example between 200 and 250 C, for example between 250 and 300 C, for example between 300 and 350 C, for example between 300 and 400 C, for example between 350 and 450 C, for example between 350 and 400 C, for example between 400 and 500 C, for example between 500 and 600 C, for example between 600 and 700 C, for example between 700 and 800 C, for example between 800 and 900 C, for example between 600 and 1100 C.

In certain embodiment, the porosity of the particulate carbon particles can be increased by activation within the VTA-CVI reactor by introducing an activation gas, comprising, but not limited to, CO2, steam, and combinations thereof. The activation temperature can be varied, for example, between 600 and 1200 C, for example between 600 and 800 C, for example between 700 and 900 C, for example between 800 and 1000 C, for example between 800 and 1100 C. In certain embodiments, the resulting particulate porous carbon particles can further traverse into the subsequent zone in the VTA-CVI reactor to accomplish CVI under the process conditions as described elsewhere in this disclosure.

In certain embodiments, the flow of the silicon containing precursor gas is co-current, i.e., flows in the same direction as the porous carbon particles traverse the heated zone. In certain preferred embodiments, the flow of the silicon containing precursor gas is counter-current, i.e., flows in the opposite direction as the porous carbon particles traverse the heated zone.

The mixture of gas can comprise between 0.1 and 1% silane and remainder inert gas. Alternatively, the mixture of gas can comprise between 1% and 10% silane and remainder inert gas. Alternatively, the mixture of gas can comprise between 10% and 20% silane and remainder inert gas. Alternatively, the mixture of gas can comprise between 20% and 50% silane and remainder inert gas. Alternatively, the mixture of gas can comprise above 50% silane and remainder inert gas. Alternatively, the gas can essentially be 100% silane gas. Suitable inert gases include, but are not limited to, hydrogen, nitrogen, argon, and combinations thereof.

There are several critical challenges to scalable and cost-effective CVI processing. These key challenges include overcoming the gas-solid diffusional barrier, i.e., barrier for the reactant gas to enter into the pores of the scaffold material and for by-product gas to exit the pores of the scaffold material, achieving sufficient heat transfer to accomplish the decomposition reaction, achieving temperature uniformity of the reacting material, and achieving porous scaffold material flowability. These challenges can be overcome, and other benefits obtained as well, by the current VTA-CVI invention described herein.

VTA-CVI is a process wherein a particulate scaffold material is conveyed by vibration through the heated region of a reactor in the presence of a thermally decomposing gas. While not being bound by theory or application, in a preferred embodiment the VTA-CVI process can be employed to produce a silicon-carbon composite material.

D. VTA-CVI to Produce Silicon-Carbon Composite Materials

The VTA-CVI process can be carried out as follows. The particulate porous carbon scaffold is introduced within a retort, wherein said retort is vibrated such that the particulate porous carbon is conveyed through the retort, and said retort comprises a heated zone. For the purpose of this disclosure, the term "retort" refers to a vessel comprising a zone in which the porous scaffold is heated, and whose geometry can be varied, and is contained within the heated zone of the reactor. In certain preferred embodiments, the carbon scaffold particles are conveyed across a rectangular surface. The VTA-CVI process can be run is various modes, for example, as batch, semi-batch, or continuous process.

The conveyance rate of the material within the retort of the VTA-CVI reactor can be varied, for example by varying the amplitude and frequency of the vibration, as well as the location(s) at which vibration is applied to the retort. In certain embodiments, the amplitude is between 0.1 mm to 1 m, for example 1 mm to 100 cm, for example 1 cm to 10 cm. In preferred embodiments, the amplitude of the vibrating retort varies between 0.01 mm and 10 cm.

The frequency of the vibration can be varied, for example between 0.01 to 100 Hz, for example between 0.1 Hz to 10 Hz. In preferred embodiments, the frequency of the vibration is between 1 Hz to 100 Hz.

In certain embodiments, the vibration is applied to the retort at the entrance of the reactor, that is, the position at which the feed carbon scaffold material is introduced into the retort. In certain embodiments, the position at which the feed porous carbon scaffold material is introduced into the retort coincides with the beginning of the heated zone. In certain embodiments, the vibration is applied to the retort at the exit of the heated zone. In certain embodiments, vibration is applied at a location between the points where the porous scaffold material enters and exits the retort, and/or between the beginning and end of the heated zone. In certain embodiments, vibration is applied to the retort at more than one position within the heated zone, such as entry, exit, and/or one or more locations in between, that is, one or more positions within the heated zone.

In certain embodiments, the porous carbon material is introduced to the VTA-CVI retort upstream of the heated zone. In certain embodiments, the porous carbon material is introduced to the VTA-CVI retort upstream of the heated zone and upstream of any position or positions where vibration is applied.

In one embodiment, vibration is applied in one position, and that position is not within the heated zone. In one embodiment, vibration is applied in one position, and said position is not within the heated zone, and said position is upstream of the heated zone relative to the movement of porous carbon scaffold material through the hot zone. In one embodiment, vibration is applied in one position, and said position is not within the heated zone, and said position is downstream of the heated zone relative to the movement of porous carbon scaffold material through the hot zone.

In one embodiment, vibration is applied in more than one position, and one or more of said positions are not within the heated zone. In one embodiment, vibration is applied in more than one position, and one or more of said positions are not within the heated zone, and one or more of said positions are upstream of the heated zone relative to the movement of porous carbon scaffold material through the hot zone. In one embodiment, vibration is applied in more than one position, and one or more of said positions are not within the heated zone, and one or more of said positions are downstream of the heated zone relative to the movement of porous carbon scaffold material through the hot zone.

In certain embodiments where vibration is applied at a single position, the frequency and/or amplitude is held constant. In certain embodiments where vibration is applied at a more than one position, the frequency and/or amplitude is held constant at each position, and is the same for all positions where vibration is applied.

In certain embodiments where vibration is applied at a more than one position, the frequency and/or amplitude is held constant at each position where vibration is applied, and is not the same for all positions where vibration is applied.

In certain embodiments where vibration is applied at more than one position, the frequency and amplitude are held constant at each position where vibration is applied, and the frequency is sequentially increased at each position where vibration is applied in the direction of sample progresses through the heated zone. In certain embodiments where vibration is applied at more than one position, the frequency and amplitude are held constant at each position where vibration is applied, and the frequency is sequentially decreased at each position where vibration is applied in the direction of sample progresses through the heated zone.

In certain embodiments where vibration is applied at more than one position, the frequency and amplitude are held constant at each position where vibration is applied, and the amplitude is sequentially increased at each position where vibration is applied in the direction of sample progresses through the heated zone. In certain embodiments where vibration is applied at more than one position, the frequency and amplitude are held constant at each position where vibration is applied, and the amplitude is sequentially decreased at each position where vibration is applied in the direction of sample progresses through the heated zone.

In certain embodiments where vibration is applied at more than one position, the frequency and amplitude are held constant at each position where vibration is applied, and the amplitude and frequency are sequentially increased at each position where vibration is applied in the direction of sample progresses through the heated zone. In certain embodiments where vibration is applied at more than one position, the frequency and amplitude are held constant at each position where vibration is applied, and the amplitude and frequency are sequentially decreased at each position where vibration is applied in the direction of sample progresses through the heated zone.

In certain embodiments where vibration is applied at more than one position, the frequency and amplitude are held constant at each position where vibration is applied, and the amplitude is sequentially increased and frequency is sequentially decreased at each position where vibration is applied in the direction of sample progresses through the heated zone. In certain embodiments where vibration is applied at more than one position, the frequency and amplitude are held constant at each position where vibration is applied, and the amplitude is sequentially decreased and frequency is sequentially increased at each position where vibration is applied in the direction of sample progresses through the heated zone.

In certain embodiments where vibration is applied at a single position, the frequency and/or amplitude is varied over time. In certain embodiments where vibration is applied at more than one positon single position, the frequency and/or amplitude is varied over time at one or more of the positions where vibrations are applied.

In certain embodiments where vibration is applied at more than one positon single position, the frequency and/or amplitude is varied over time at one or more of the positions where vibrations are applied with the result of maintaining porous carbon scaffold material within the heated zone. In this latter embodiment, the process can be a batch or semi-batch process.

In certain embodiments, the VTA-CVI process can be combined with other process or processes. For example, pyrolyzed porous carbon particles can traverse through the reactor in two zones, wherein the pyrolyzed carbon particles traverse though a first zone, and this first zone is an activation zone, wherein vibration is applied at one position or more than one position within the first heated zone, and subsequently the resulting activated porous carbon particles traverse through the second zone, wherein vibration is applied at one position or more than one position within the second heated zone, and this second zone is the VTA-CVI zone.

In certain embodiments, a particle size reduction is accomplished to the porous carbon material before the VTA-CVI process. In certain embodiments, a particle size reduction is accomplished to the porous carbon material after the VTA-CVI process. In certain embodiments, a particle size reduction is accomplished to the porous carbon material before and after the VTA-CVI process. In certain embodiments, a particle size reduction is accomplished to the pyrolyzed carbon material before the VTA-CVI process. In certain embodiments, a particle size reduction is accomplished to the pyrolzyed carbon material after the VTA-CVI process. In certain embodiments, a particle size reduction is accomplished to the pyrolzyed carbon material before and after the VTA-CVI process.

In certain embodiments, vibration is applied at one position, or more than one position, and the porous carbon material traverses through the heated zone at a constant rate, i.e., same rate at each position within the heated zone. In certain other embodiments, vibration is more than one position, and the porous carbon material traverses through the heated zone at a non-constant rate. A preferred mode for this latter embodiment is the case where the porous carbon accelerates as the material progresses thought the heated zone. Without being bound by theory, this latter mode results in more precise control over the porous carbon material accurately achieving the final desired level of silicon loading.

The areal loading of the porous carbon material for vary, for example from 0.01 to 1000 g/cm2, for example from 0.1 to 100 g/cm2, for example from 0.1 to 50 g/cm2, for example from 0.1 to 40 g/cm2, for example from 0.1 to 20 g/cm2, for example from 0.1 to 10 g/cm2, for example from 0.1 to 5 g/cm2, for example from 0.1 to 2 g/cm2, for example from 0.1 to 1 g/cm2. In certain embodiments, the area loading of the porous carbon material varies as the material traverses through the heated zone. In certain embodiments, the area loading of the porous carbon material decreases as the material traverses through the heated zone. In certain embodiments, the area loading of the porous carbon material increases as the material traverses through the heated zone. In certain embodiments, the area loading of the porous carbon material increases and the silicon content of the porous carbon particles increases as the material traverses through the heated zone.

The conveyance rate of porous carbon scaffold material can be varied. For example, the conveyance rate can be described as a linear velocity, and can vary from 0.01 to 1000 m/h, for example from 0.1 to 100 m/g, for example from 0.1 to 10 m/g, for example from 0.1 to 5 m/g, for example from 0.1 to 2 m/g, for example from 0.1 to 1 m/g, The certain embodiments, vibration is applied continuously. In other embodiments, vibration is applied non-continuously, i.e., as pulses separated by period where no vibration is applied. According to these embodiments, the duration of pulses can be varied, for example from 1 sec to 10 h, for example from 1 sec to 1 h, for example from 1 sec to 30 min, for example from 10 sec to 10 min. In a similar fashion, the duration of pulses can be varied, for example from 1 sec to 10 h, for example from 1 sec to 1 h, for example from 1 sec to 30 min, for example from 10 sec to 10 min. For the above embodiments, the duty cycle is defined as the duration of each pulse divided by the sum of the duration of each pulse and each period of non-pulse, expressed as percentage. The duty cycle can vary, for example from 0.01% to 99.99%, for example from 0.1% to 99.9%, for example from 1% to 99%, for example from 10% to 90%, for example from 20% to 80%, for example from 30% to 70%, for example from 40% to 60%.

In some embodiments, the retort is horizontal. In other preferred embodiments the surface is sloped downwards relative to the travel direction of the porous scaffold particle, a case that can be described as a negative angle of travel. According to these embodiments, the negative angle of travel can vary, for example from 0.01° to 30°, for example from 0.1° to 30°, for example from 1° to 30°, for example from 0.01° to 20°, for example from 0.01° to 10°, for example from 0.1° to 5°, for example from 0.1° to 2°, for example from 0.1° to 1°. In other embodiments the surface is sloped upwards relative to the travel direction of the porous scaffold particle, a case that can be described as a positive angle of travel. According to these embodiments, the positive angle of travel can vary, for example from 0.01° to 30°, for example from 0.01° to 20°, for example from 0.01° to 10°, for example from 0.1° to 5°, for example from 0.1° to 2°, for example from 0.1° to 1°.

In certain embodiments, the retort comprises various sections, wherein each section has a distinct angle of travel. For example, the retort can comprise two sections, and upstream section that is horizontal, and a downstream section that has a negative angle of travel. In certain embodiments, the retort comprises two or more sections, with each section having s sequentially decreasing angle of travel. Without being bound by theory, this latter embodiment results in more precise control over the porous carbon material accurately achieving the final desired level of silicon loading.

The VTA-CVI reactor can be constructed using a gas-tight alloy retort. The alloy could be stainless steel (316, 304, etc.) or more exotic alloys such as Inconel or Hastelloy. The retort is mounted on vibration isolating spring footings. Vibration generating motors (VGM) are mounted directly on the retort. The number of VGMs used is dependent on the design. The VGMs are positioned to create both vertical and horizontal vibrational modes with the cumulative vibrational vector oriented in the direction of desired material flow. At the inlet end of the retort a raw material feed chute is installed, and at the product outlet, a discharge chute is installed. A process gas injector is installed at product outlet end, and an exhaust gas lance is installed at the material inlet end of the retort (alternate modes of gas configuration are listed in the following section). The gas-tight retort is heated externally to elevate the material temperature and drive the reaction. In the case of silicon CVI, the powder temperature must exceed 200 C, for example exceed 250 C, for example exceed 350 C, for example exceed 400 C, for example exceed 450 C, for example exceed 500 C. For other embodiments of silicon CVI, the powder temperature must be in the range of 200 C to 600 C, for example 200 to 300 C, for example 300 to 400 C, for example 400 to 500 C, for example 500 to 600 C, for example 250 to 350 C, for example 350 to 450 C, for example 450 to 550 C, for example 300 to 500 C, for example 350 to 450 C, for example 300 to 600 C.

Additionally, gas heaters may be used to elevate the process gas temperature. Heating of the retort can be accomplished using electrical resistive heating elements. Alternatively, a hot gas plenum can be constructed around or under the retort and heated air or other gas can be circulated to heat the retort. Ideally, only the retort bottom is heated resulting cooler surfaces on the retort walls and ceiling; this reduces deposition of process gas onto reactor walls because the scaffold is hotter than all other gas-accessible surfaces. The retort can be positioned level to the ground, or at a declined angle (−15-0 degrees) with material traveling down-slope.

Residence time of powder flowing through the VTA-CVI reactor is controlled using the vibratory frequency and amplitude and direction of force. Also, the VGMs can be cycled using an on-off timer or programmed variable frequency drive (VFD) to produce very long residence times. For example, VGMs can be programed on for 3 seconds and off for 5 minutes to generate a plug-flow continuous reactor; the resulting duty cycle in this embodiment is 1%.

The gas injector/exhaust can be configured for counter-current flow of material to gas. It is also possible to configure this for co-current flow of material and gas. It is also possible to draw exhaust gas from the center of the retort and inject gas from both ends. It is also possible to inject gas in the middle of the retort and exhaust from one or both ends. The retort can be rectangular in shape, and cylindrical/tubular designs are also possible.

The above embodiments are not limited to silane gas as the silicon containing precursor. Additional silane containing precursors in this context include, but are not limited to disilane, trisilane, tetrasilane, chlorosilane, dichlorosilane, trichlorosilane, and tetrachlorosilane, and combinations thereof. Additional silicon containing species include, but are not limited to silane comprising alkyl moieties, such as methyl silane, dimethyl silane, trimethyl silane, tetramethyl silane, methyl disilane, dimethyl disilane, trimethyl disilane, tetramethyl disilane, hexamethyl silane, and combinations thereof.

The pressure within the VTA-CVI reactor can be varied, for example can be ambient, or about 101 kPa. In certain embodiments, the pressure can be less than ambient, for example less than 101 kPa, for example less than 10.1 kPa, for example less than 1.01 kPa. In certain other embodiments, the pressure within the VTA-CVI reactor can be greater than ambient, for example between 101 kPa and 1010 kPa, for example between 1010 kPa and 10100 kPa.

The bed depth of porous carbon scaffold within the VTA-CVI reactor can vary, for example can be from 1 mm to 1 cm. In other embodiments, the bed depth of porous carbon scaffold within the VTA-CVI reactor can be from 1 cm to 10 cm. The bed expansion within the VTA-CVI scaffold was analyzed by nitrogen sorption analysis as known in the art. The total pore volume for the porous carbon scaffold was 0.77 cm2/g, and the surface area was 1724 m2/g. The porous carbon scaffold comprises micropores, mesopores, and/or macropores. For example, the porous carbon scaffold comprises greater 70% micropores, 0 to 30% mesopores, and 0 to 30% macropores. For example, the porous carbon scaffold comprises greater 80% micropores, less than 20% mesopores, and less than 20% macropores. For example, the porous carbon scaffold comprises greater 80% micropores, less than 10% mesopores, and less than 10% macropores. For example, the porous carbon scaffold comprises greater 90% micropores, less than 10% mesopores, and less than 10% macropores. For example, the porous carbon scaffold comprises greater 90% micropores, less than 5% mesopores, and less than 5% macropores. The tap density for the porous carbon scaffold as measured as known in the art was 0.42 g/cm3. The total ash content for the porous carbon scaffold as determined by tXRF as known in the art was 0.002%.

Silane and nitrogen gas were injected into the furnace, exhaust gas was vented to a laboratory scrubber. The furnace was operated at atmospheric pressure. A test was completed using this apparatus to validate silicon CVI on a static bed of microporous carbon at varying bed depths. For each test, the sample and furnace were ramped to the desired reaction temperature under nitrogen, exposed to 100% silane gas for the desired time and at the desired flow rate, cooled under nitrogen to room temperature, and exposed to air to passivate the samples. Si—C composite materials produced were evaluated for silicon content and homogeneity by TGA as known in the art. See the matrix of experimental conditions and results in the table below. As can be seen, the static approach can produce silicon on the porous carbon, however, this process may have throughput limitations for commercial scalability. Therefore, processes that are non-static may have a throughput advantage.

| Bed Depth (inches) | Carbon Mass (g) | Silane flow rate (l/min) | Reaction Temperature C. | Silicon Loading by TGA (%) | Elutriation (%) | Silane mol % |
|---|---|---|---|---|---|---|
| 0.02 | 0.2 | 0.006 | 450 | 46 | None Detected | 1.25 |
| 0.03 | 0.4 | 0.4 | 440 | 21 | None Detected | 100 |
| 0.25 | 3 | 0.2 | 430 | 38 | None Detected | 100 |
| 0.43 | 23 | 0.2 | 430 | 46 | None Detected | 100 |
| 0.75 | 280 | 2.6 | 400 | 45 | None Detected | 100 | reactor can be defined as the height of the carbon scaffold subjected to the vibration during operation of the VTA-CVI reactor divided by the height of the carbon scaffold at rest, that is when not subjected to any vibration. The bed expansion within the VTA-CVI reactor can vary, for example 1.001 to 1.01, for example 1.01 to 1.1, for example 1.1 to 2.

EXAMPLES

Example 1. Si—C composite produced by static CVI process. A laboratory tube furnace with a 3-inch diameter tube and 24-inch long hot zone was setup in a fume hood. An alumina sample boat was used to hold the porous carbon scaffold in the furnace.

The particle size distribution for the porous carbon scaffold was determined by laser light scattering as known in the art. The resulting particle size distribution yielded Dv1=1.2 um, Dv10=2.5 um, Dv50=6.9 um, Dv90=11.5 um, and Dv100=20.1 um. The pore size for the porous carbon Example 2. Si—C composite produced by fluidized bed reactor (FBR). One approach for a non-static reactor that is known in the art, is FBR. A laboratory fluidized bed reactor was constructed to deposit silicon onto microporous micronized carbon particles. The vertically oriented reactor consisted of a 2-inch diameter process tube with a gas distributor plate welded in the middle of the tube. Process gas was injected below the distributor plate designed to fluidize the carbon particles. Exhaust gas was vented from the top of the reactor retort to a laboratory gas abatement system. The retort tube was heated by a 24-inch long vertically mounted tube furnace. A 50 g sample of microporous carbon was loaded onto the distributor plate through a feed port on the retort. Nitrogen gas flow was initiated at a velocity of 23 ft/min through the tube to fluidize the carbon. The retort temperature was ramped to 450 C over 30 minutes. The nitrogen flow was proportionally reduced to maintain a 23 ft/min velocity accounting for hot gas expansion. At 450 C, the nitrogen flow was discontinued and a flow of 1.25% silane in nitrogen was initiated to achieve fluidization at a velocity of 23 ft/min. After 2 hours, the flow was switched back to nitrogen and the system was cooled to room temperature. At room temperature, the materials were slowly exposed to air to passivate the sample. Only 8 grams of material was recovered from the reactor. All other material had elutriated from the reactor and collected in the abatement system. The materials collected were silicon-carbon composite comprising 51% silicon and 49% carbon as measured by TGA. While this approach was able to yield a desired addition of silicon on the porous carbon over 2 hours, over that 2-hour period the carbon material loss due to elutriation was 92% of the starting sample. Therefore, the approach of fluid bed was not deemed commercially suitable without substantial improvement to address this issue.

Yet another non-static approach examined was a rotary kiln. In this study, a batch rotary kiln comprising a 10 inch diameter Inconel batch process tube with a 54-inch long heated reaction zone was utilized. A 0.75-inch diameter process gas injection nozzle was installed on one end of the process tube, and a 2-inch diameter exhaust vent was installed on the opposite end. Micronized porous carbon materials were loaded through a hatch on the exhaust side of the process tube. For each test, micronized porous carbon materials were loaded into the reactor at room temperature. The reactor was ramped to the target reaction temperature under an inert nitrogen atmosphere. The tube was rotated at the target speed during the entire process. Once at temperature, a mixture of 1.25 mol % silane in nitrogen was injected into the tube at a target flow rate. After many tests, silicon-carbon composites were produced, however, the process yields were very low due to elutriation of material in the gas stream. Below is a table of select process conditions and associated elutriation rates based on starting carbon materials and recovered product mass with associated silicon loading.

| Test # | Carbon Amount (g) | Temperature (° C.) | Rotation Speed (rpm) | Flow rate (L/min) | Elutriation (%/hr) |
|---|---|---|---|---|---|
| 1 | 560 | 456-598 | 1.5 | 70 | 2.45 |
| 3 | 300 | 490 | 0.5 | 35 | 4.39 |
| 5 | 300 | 480 | 1.5 | 70 | 5.24 |
| 11 | 1000 | 450 | 0.5 | 35 | 3.00 |

Overall, rotary kiln technology can be used for CVI reactions, but the tumbling action of particles in the furnace results in significant entrainment and elutriation when working with micronized powders. Observations in the fluid bed reactor and rotary kiln led us to further examine methods of accomplishing the low elutriation observed in the static bed tests of Example 1, but in a configuration that enabled higher continuous throughput.

Example 3. Vibratory convey test system. A vibratory convey test system was constructed by mounting a self-synchronized vibratory exciter motor to a 2.75" wide stainless-steel retort with 2.5" high walls that was 6 ft long. The entire retort and motor assembly was mounted on isolation springs and was declined at a 15-degree angle. Micronized porous carbon was loaded into the elevated end of the retort and the vibratory motor was turned on at 65 Hz with the entire retort at ambient room temperature (20 C). The vibrational force direction of the vibratory exciter motor was oriented at 90 degrees angle of attack orthogonal to the retort powder deck. The micronized porous carbon traveled smoothly to the other end of the retort in ~30 seconds.

In a following test on the setup described above, the vibratory exciter motor starter was configured with an on/off timer with a programmed 3 seconds on, and 20 minutes off. This program enabled an overall convey velocity of 0.033 ft/min which would enable a 3 hr residence time for material to flow through the reactor. The required residence time for a CVI reaction can be achieved using such a pulse program with pulse parameters accounting for the entire length of the retort.

In a following test on the setup described above, a powder feeder was used to slowly meter micronized porous carbon into the retort with the vibratory exciter motor set on a pulse program of 3 seconds on, 20 minutes off at 65 Hz. It was observed that bed depth of the porous carbon in the retort can be modulated precisely by adjusting feed rate while holding all other process variables constant (vibration frequency, vibration angle, and vibration pulse frequency and duration). Using porous carbon scaffold with a bulk density of 0.25 g/cc, bed depths of ~0.25 inch and ~0.5 inch were achieved in stable conditions along the length of the entire 6-foot apparatus at feed rates of ~0.48 kg/hr, ~0.98 kg/hr respectively.

In a following test on the identical setup described above, a process gas injection nozzle was welded to the product discharge end of the retort, and an exhaust gas vent was welded to the product inlet side of the retort. A nitrogen flow rate of 12 l/min was applied across the retort. The vibratory exciter motor was initiated on a pule program of 3 seconds on and 20 minutes off at a frequency of 65 Hz when on. This enabled an overall powder convey velocity of 0.033 ft/min for an overall powder residence time of 3.0 hrs across the retort length. The feed hopper was loaded with 500 g of micronized porous carbon with a bulk density of 0.25 g/cc. The powder feeder was initiated at a rate of ~0.5 kg/hr. The system was allowed to run for 5 hrs to assure all materials could transfer through the retort and into the product collection vessel. After 5 hr 495 g of carbon materials were collected from the product vessel. This indicated total elutriation rate of 1%. This result validated a significantly lower elutriation rate relative to fluid bed reactor and rotary kiln processing (2.45 to 5.24% per hour). Without being bound by theory, the elutriation rate from the VTA-CVI reactor can be further lowered, for example to less than 1% per hour, for example less than 0.5% per hour, for example less than 0.1% per hour, for example less than 0.01% per hour.

In a subsequent test, the identical apparatus described in the previous test was passed through a 3-zone electrically heated tube furnace. The heated furnace length was 4.5 ft or 75% of the 6 ft retort length. The retort was heated to 450 C in all three zones and a nitrogen flow of 12 l/min was applied to the furnace. The vibratory exciter motor was initiated on a pule program of 3 seconds on and 20 minutes off at a frequency of 65 Hz when on. This enabled an overall powder convey velocity of 0.033 ft/min for an overall powder residence time of 3.0 hr across the retort length based on cold flow testing. The feed hopper was loaded with 500 g of micronized porous carbon with a bulk density of 0.25 g/cc. The powder feeder was initiated at a rate of ~0.5 kg/hr. The system was allowed to run for 5 hr to assure all materials could transfer through the retort and into the product collection vessel. After 5 hr the product collection vessel was opened and an unexpected result was observed. Only 2 g of material had travelled into the collection container. The retort end-cap was opened and it was observed that most of the porous carbon powder was stuck in retort on the downstream edge of the heated section. In this section, the retort temperature drops from 450 C to ~75

C over ~10 inches. It was hypothesized that upon cooling, hot porous carbon materials cling to cooler surfaces. Example 4 details testing that was completed to confirm this hypothesis.

Example 4. Validation of unexpected result. To validate the unexpected result observed in Example 3, the following series of tests were conducted. A vibratory convey test system was constructed by mounting a self-synchronized vibratory exciter motor to an 8″ wide stainless-steel trough with 6″ high walls that was 10 ft long. The entire trough and motor assembly was mounted on isolation springs and was declined at a 4-degree angle. Unlike the apparatus described in Example 3, the vibrational angle of attack of the vibratory exciter motor was oriented at 70 degrees toward the declined end of the trough. This adjustment in force vector enables the system to function with the powder deck declined at a lower angel (in this case 4 degrees). It is also possible to convey on a completely flat surface and an inclined surface by adjusting these vibrational force vectors. Underneath the trough was a sealed stainless steel plenum. A hot air recirculation system was installed to blow heated air through the plenum up to 2 foot from the declined end of the trough all the way to the inclined end of the trough. This system effectively heated the bottom of the entire trough to 300 C with the exception of the 2-foot end on the discharge side. Micronized porous carbon was loaded into the elevated end of the trough using a volumetric feeder. The vibratory exciter motor starter was configured with an on/off timer with a programmed 3 seconds on at 65 Hz, and 90 seconds off. This program enabled an overall convey velocity of 0.166 ft/min. When the vibratory exciter pulse program initiated the micronized porous carbon moved uniformly down the length of the trough. Temperature measurements with an infrared thermometer validated the bed of carbon reached 300 C uniformly across the bed. The material conveyed across the entire heated length of the trough but would not convey onto the cooler section in the last 2 feet of the trough. In this area the heated trough temperature dropped from 300 C to 80 C. The micronized porous carbon appeared to stick to the cooler metal surface of the trough.

A following experiment was conducted using the identical apparatus described in the first experiment of Example 4 above accept the heated air plenum extended the entire length of the trough. Micronized porous carbon was loaded into the elevated end of the trough using a volumetric feeder. The vibratory exciter motor starter was configured with an on/off timer with a programmed 3 seconds on at 65 Hz, and 90 seconds off. This program enabled an overall convey velocity of 0.166 ft/min. When the vibratory exciter pulse program initiated the micronized porous carbon moved uniformly down the length of the trough. Temperature measurements with an infrared thermometer validated the bed of carbon reached 300 C uniformly across the bed. Unlike the previous test, the bed of hot micronized porous carbon traveled uniformly across the entire trough and flowed off the end of the trough into a collection container.

To overcome the unexpected finding in Example 3, VTA-CVI reactors for use with micronized porous carbon must effectively heat the materials until they can be effectively removed from the retort by means other than vibratory convey. For instance, similar to the second test in Example 4, a VTA-CVI reactor can be constructed with a heated air plenum on the underside of the retort that heats the entire convey surface of the retort including the product discharge spout allowing the materials to fall out of the retort via gravity and collect in a container or alternate conveyor. See FIG. 1, which presents a schematic depicting this concept with a heated air plenum.

In certain embodiments, the particulate silicon-carbon composite particles exit the VTA-CVI reactor at the same temperature as the heated zone, in order to avoid any clumping or clogging of material in the reactor. In certain other embodiments, the particulate silicon-carbon composite particles exit the VTA-CVI reactor at the temperature lower than as the heated zone, but above ambient, in order to avoid any clumping or clogging of material in the reactor. For example, the particulate silicon-carbon composite particles exit the VTA-CVI reactor at the temperature 100 C lower than as the heated zone, for example 200 C lower than as the heated zone, for example 300 C lower than as the heated zone, for example 400 C lower than as the heated zone, for example 500 C lower than as the heated zone, for example 600 C lower than as the heated zone.

Figure 2:
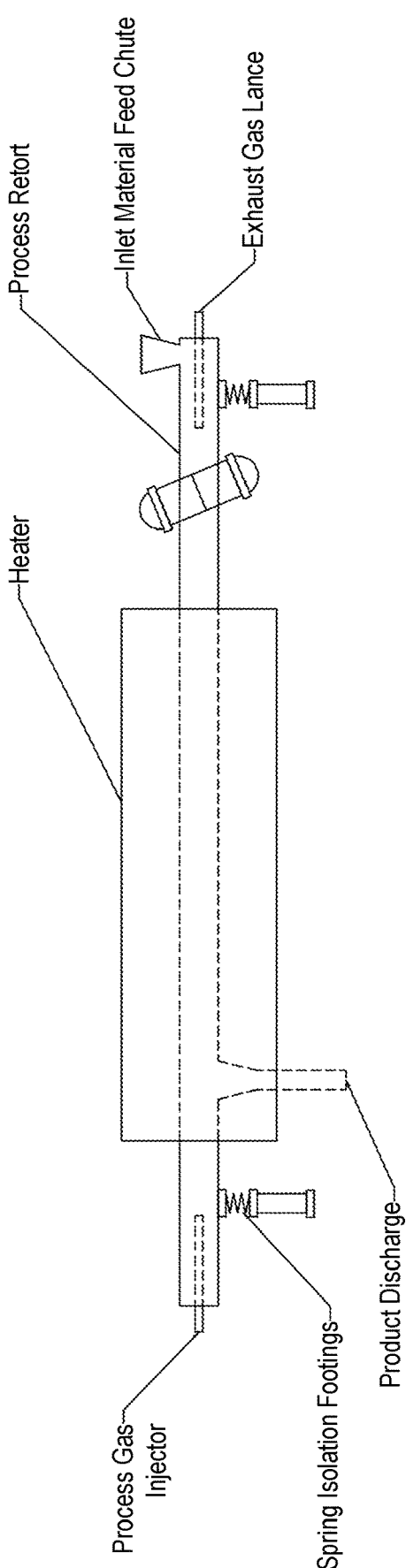
FIG. 2. Schematic of VTA-CVI reactor comprising a heated retort.

Additionally, if a heated air plenum is not desired to achieve higher temperatures, improve energy efficiency, or heat the entire retort, a VTA-CVI reactor can be constructed where the entire retort passes through an electrically heated furnace box. Care in the design must be made to assure the vibrating retort cannot contact the furnace. To overcome the unexpected observation in Example 3, the product outlet should be heated by the furnace. See FIG. 2, which presents a schematic detailing this concept.

Figure 3:
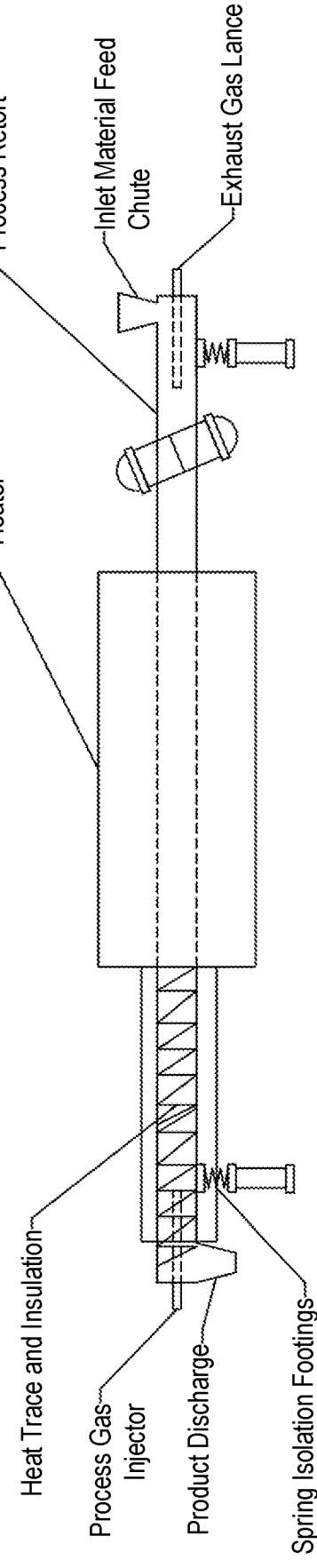
FIG. 3. Schematic of VTA-CVI reactor comprising a heated retort and heated outlet.

Example 5. Production of Si—C in the VTA-CVI reactor. The identical apparatus described in Example 3 was configured with product discharge spout that was welded to the bottom of the declined end of the retort and was connected to a product collection can using a flexible bellows for vibration isolation. The retort was passed through a 3-zone electrically heated tube furnace. The heated furnace length was 4.5 ft or 75% of the 6 ft retort length. A process gas inlet was welded to the declined end of the retort and an exhaust gas outlet was welded to the inclined end of the retort. The declined end of the retort protruding from the furnace was wrapped with heat trace and insulation to heat the outlet section and prevent issues with material flow observed in Example 4. See FIG. 3, which depicts the schematic of this apparatus The furnace on the above described assembly was heated to 450 C in all three zones. The vibratory exciter motor was programmed for 3 seconds on and 20 minutes off with a frequency of 65 Hz when on. The vibration program was initiated. A process gas mixture of 1.25% silane diluted in nitrogen was flown into the retort at a continuous rate of 8.3 l/min. The volumetric feeder was initiated to feed micronized porous carbon into the retort at a rate of 0.48 kg/hr for bed depth of ~0.25 inches. The process was left to operate at this condition for 3 hr and then the carbon feed was stopped. After an additional 2.25 hours the silane/nitrogen flow was discontinued and switched to 100% nitrogen. The retort was cooled to room temperature and the product collection container was opened. Silicon carbon composite materials with 48% silicon and 52% carbon as measured by TGA were collected from the container.

Example 6. Characterization of Si—C produced in the VTA-CVI reactor. Si—C composites were produced using the VTA-CVI reactor and processing as described in Example 5. These materials were characterized for their physicochemical properties, specifically their surface area and pore volume, and for their silicon loading (see Example 1 for further method details). The data for four representative Si—C samples are presented the following table.

| Sample | Surface Area (m2/g) | TGA Silicon Content (%) |
|---|---|---|
| 6-1 | 5 | 45.9 |
| 6-2 | 10 | 49.1 |
| 6-3 | 115 | 43.8 |
| 6-4 | 118 | 43.1 |

Sample 6-4 was further characterized for electrochemical performance as anode material in lithium ion batteries. One test in this regard is half cell evaluation. For the purpose of this example, Si—C sample 6-3 was blended in an anode comprising active material, binder (e.g., CMC-SBR), and conductive carbon (e.g., C45) at 60%, 20%, and 20% of the electrode mass respectively. The electrolyte comprised 1 M LiPF6 in EC:DEC w/10% FEC. The half-cells were cycled as described in the table below.

| Cycle number | Step | C-rate CC | CV | Cut-off condition |
|---|---|---|---|---|
| 1 to 5 | Insertion | C/10 | C/20 | OCV-5 mV |
|  | Extraction | C/10 |  | 5 mV-0.8 V |
| 6 to 25 | Insertion | C/5 | C/20 | 0.8 V-5 mV |
|  | Extraction | C/5 |  | 5 mV-0.8 V |
| 26 to 30 | Insertion | C/2 | C/5 | 0.8 V-5 mV |
|  | Extraction | C/2 |  | 5 mV-0.8 V |
| 30.5 | Insertion | C/10 | C/20 | 0.8 V-5 mV |

Electrochemical characterization of material produced in Example 5 is described in the table below.

| First Cycle Insertion (mAh/g) | First Cycle Extraction (mAh/g) | Average Coulombic Efficiency Cycle 7-25 | Capacity Retention Cycle 25/Cycle 7 (%) |
|---|---|---|---|
| 1743 | 1253 | 0.9980 | 99.0% |

Figure 4:
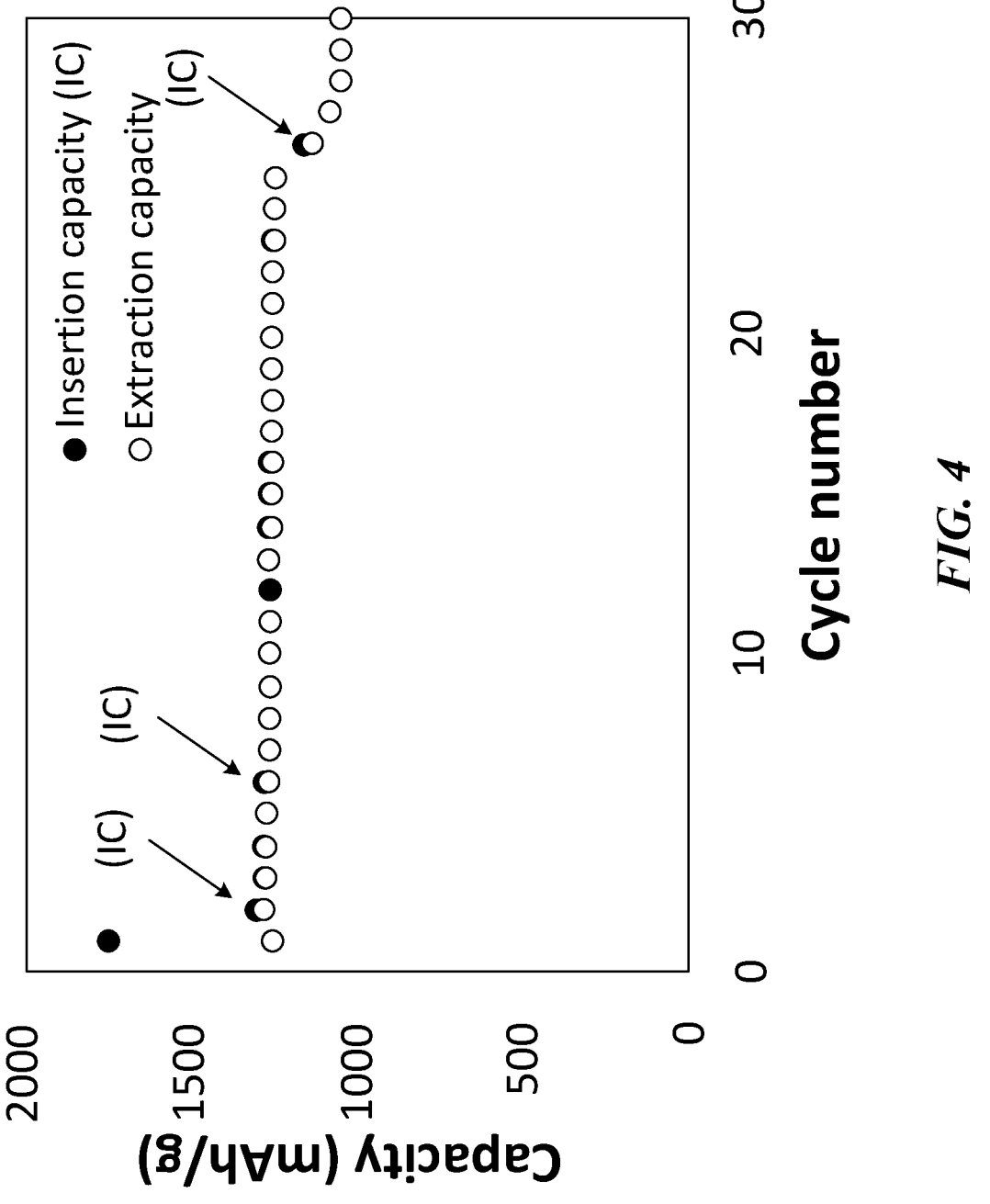
FIG. 4. Capacity for half cells comprising SiC produced in the VTA-CVI reactor.
Figure 5:
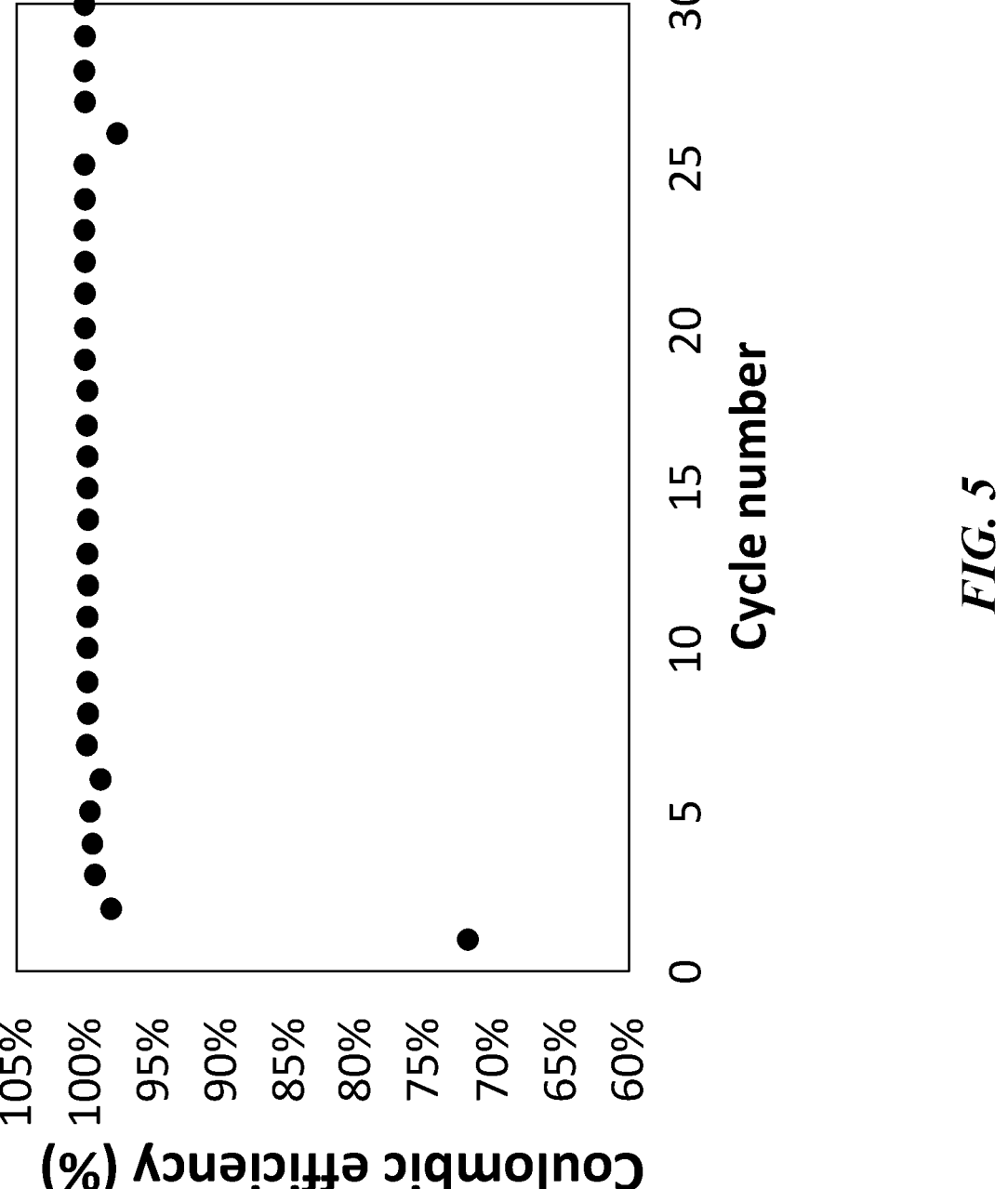
FIG. 5. Coulombic efficiency for half cells comprising SiC produced in the VTA-CVI reactor.

FIG. 4 and FIG. 5 depict the capacity (both insertion and extraction) vs. cycle number and Coulombic efficiency vs. cycle number respectively. As can be seen, the VTA-CVI reactor was successful in producing Si—C composite material with the targeted silicon loading as achieved for static processing (Example 1); furthermore, and importantly, the anode material produced in the VTA-CVI reactor had desirable electrochemical properties such as high average Coulombic efficiency and capacity retention.

EXPRESSED EMBODIMENTS

Embodiment 1. A method for producing a particulate composite material comprising a porous scaffold comprising a first element and one or more secondary elements, comprising the following steps:
  a. traversing the particulate porous scaffold material through a heated zone within a retort by subjecting the porous scaffold to vibration applied to the retort, and
  b. introducing a gas comprising one or more secondary elements, wherein said gas permeates within the pores of the porous scaffold and decomposes into one or more secondary elements.

Embodiment 2. A method for producing a particulate composite material comprising a porous scaffold comprising an element other than silicon and silicon comprising the following steps:
  a. traversing the particulate porous scaffold material through a heated zone within a retort by subjecting the porous scaffold to vibration applied to the retort, and b. introducing a gas comprising a silicon containing precursor gas, wherein said gas permeates within the pores of the porous scaffold and decomposes into silicon.

Embodiment 3. A method for producing a particulate silicon-carbon composite material comprising the following steps:
  a. traversing the particulate porous carbon scaffold material through a heated zone within a retort by subjecting the porous scaffold to vibration applied to the retort, and
  b. introducing a gas comprising a silicon containing precursor gas, wherein said gas permeates within the pores of the porous scaffold and decomposes into silicon.

Embodiment 4. The method of any one of embodiments 1 through 3 wherein the heated zone within the retort is held at a temperature between 350 and 450 C.

Embodiment 5. The method of any one of embodiments 1 to 3, wherein the silicon containing precursor is silane, disilane, trisilane, tetrasilane, monochlorosilane, dichlorosilane, trichlorosilane, tetrachlorosilane, or a combination thereof.

Embodiment 6. The method of any one of embodiments 1 to 5, wherein the pressure within the retort is below atmospheric pressure.

Embodiment 7. The method of any one of embodiments 1 to 5, wherein the pressure within the retort is above atmospheric pressure.

Embodiment 8. The method of any one of embodiments 1 to 5, wherein the vibration duty cycle is 1% to 99%.

Embodiment 9. The method of any one of embodiments 1 to 5, wherein the retort is horizontal.

Embodiment 10. The method of any one of embodiments 1 to 5, wherein the retort comprises a negative angle of travel, and said negative angle of travel is 1° to 30°.

Embodiment 11. The method of any one of embodiments 1 to 5, wherein the retort comprises two or more zones, and the angle of travel becomes sequentially more negative from upstream to downstream, relative to the direction that the porous scaffold material traverses the retort.

Embodiment 12. The method of any one of embodiments 1 to 5, wherein vibration is applied to the retort at one position.

Embodiment 13. The method of any one of embodiments 1 to 5, wherein the frequency of the vibration is 1 Hz to 100 Hz.

Embodiment 14. The method of any one of embodiments 1 to 5, wherein the amplitude of the vibration is 0.1 mm to 10 cm.

Embodiment 15. The method of any one of embodiments 1 to 5, wherein vibration is applied to the retort at more than one position.

Embodiment 16. The method of any one of embodiments 1 to 5, wherein only the powder convey surface of the retort is heated to between 350 C and 450 C.

Embodiment 17. The method of any one of embodiments 1 to 5, wherein the entire retort length including the product outlet is heated to between 350 C and 450 C.

Embodiment 18. The method of any one of embodiments 1 to 5, wherein static mixers such as chevrons, vertical step-downs, or baffles are fixed to the powder convey surface to enhance powder mixing.

Embodiment 19. The method of any one of embodiments 1 to 5, wherein the material residence time and overall rate of convey is modulated by pulsing the vibrations using a programmable timer.

Embodiment 20. The method of any one of embodiments 1 to 5, wherein the material residence time and overall rate of convey is modulated by automatically adjusting the angle of travel of the vibration force on a programmable timing sequence.

From the foregoing it will be appreciated that, although specific embodiments of the invention have been described herein for purposes of illustration, various modifications may be made without deviating from the spirit and scope of the invention. Accordingly, the invention is not limited except as by the appended claims.

U.S. provisional patent application No. 63/063,822, filed Aug. 10, 2020 is hereby incorporated herein by reference, in its entirety. The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims but should be construed to include all possible embodiments along with the full scope of equivalents to which such claims are entitled. Accordingly, the claims are not limited by the disclosure.

The invention claimed is:

1. A process for preparing silicon-carbon composite particles, the process comprising:
   (a) providing a particulate porous carbon;
   (b) subjecting the particulate porous carbon to a vibrating surface to traverse the particulate porous carbon through a heated zone of a reactor, wherein the heated zone comprises a retort;
   (c) providing a silicon-containing gas within the heated zone of a reactor to impregnate silicon within the particulate porous carbon, wherein the silicon-containing gas comprises silane, disilane, trisilane, tetrasilane, monochlorosilane, dichlorosilane, trichlorosilane, tetrachlorosilane, or any combination thereof; and
   (d) discharging the resulting silicon-carbon composite particles from the reactor; and
   (e) applying heat to an underside of the retort and a product discharge spout during the discharging of the resulting silicon-carbon composite particles in order to maintain the resulting silicon-carbon composite particles at the same temperature as the heated zone of the reactor, or at a temperature 0° C. to 300° C. lower than the heated zone of the reactor but above ambient.

2. The process according to claim 1, wherein the particulate porous carbon comprises a Dv50 between 1 μm and 100 μm.

3. The process according to claim 1, wherein the particulate porous carbon comprises greater than 80% micropores, less than 10% mesopores, and less than 10% macropores.

4. The process according to claim 1, wherein the heated zone is maintained at a temperature of 300° C. to 600° C.

5. The process according to claim 1, wherein the heated zone is maintained at a temperature of 600° C. to 1100° C.

6. The process according to claim 1, wherein the elutriation from the reactor is less than 1% per hour.

7. The process according to claim 1, wherein the silicon containing gas comprises silane.

8. The process according to claim 1, wherein the silicon-containing gas within the reactor further comprises an inert gas selected from the group consisting of hydrogen, nitrogen, argon, and combinations thereof.

9. The process according to claim 1, wherein the gas pressure within the reactor is at atmospheric pressure.

10. The process according to claim 1, wherein the gas pressure within the reactor is below atmospheric pressure.

11. The process according to claim 1, wherein the gas pressure within the reactor is above atmospheric pressure.

12. The process according to claim 1, wherein the resulting silicon-carbon composite particles are discharged from the reactor while maintaining the resulting silicon-carbon composite particles at a temperature 0° C. to 100° C. lower than the heated zone of the reactor.

13. The process according to claim 1, wherein the vibrating surface comprises a heated air plenum.

14. The process according to claim 1, wherein the vibrating surface comprises a heated retort.

15. The process according to claim 1, wherein the process is a batch process.

16. The process according to claim 1, wherein the process is a continuous process.

17. The process according to claim 1, wherein vibrating surface is sloped downwards relative to the travel direction of the particulate porous carbon.

18. The process of claim 1, further comprising:
   (f) subjecting the silicon-carbon composite particles to a particle size reduction.

19. The process of claim 18, wherein:
   the particulate porous carbon comprises a Dv50 between 1 μm and 100 μm and also comprises greater than 80% micropores, less than 10% mesopores, and less than 10% macropores;
   in step (b), the temperature of the heated zone is maintained at a temperature between 30° and 600° C.;
   in step (c), silane gas is provided within the heated zone of the reactor to impregnate silicon within the particulate porous carbon; and
   in steps (d) and (e), the resulting silicon-carbon composite particles are discharged from the reactor while maintaining the resulting silicon-carbon composite particles at a temperature of at least 300° C.

20. The process of claim 1, wherein in step (b), the temperature of the heated zone is maintained at a temperature between 600 and 1200° C., and the process further comprises:
   (b1) providing an activation gas to increase the porosity of the particulate porous carbon obtained in step (b); and
   (b2) subjecting the particulate porous carbon obtained in step (b1) to a vibrating surface to traverse the particulate carbon through a heated zone of a reactor, wherein the temperature of the heated zone in maintained at a temperature between 30° and 600° C.; and
   wherein in step (c), silane gas is provided within the heated zone of the reactor to impregnate silicon within the particulate porous carbon.

*    *    *    *    *